(12) United States Patent
Shen et al.

(10) Patent No.: US 12,322,620 B2
(45) Date of Patent: Jun. 3, 2025

(54) REFLECTIVE WAVEPLATES FOR PUPIL POLARIZATION FILTERING

(71) Applicant: KLA Corporation, Milpitas, CA (US)

(72) Inventors: Chong Shen, San Jose, CA (US); Guoheng Zhao, Palo Alto, CA (US); Bret Whiteside, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 145 days.

(21) Appl. No.: 17/829,296

(22) Filed: May 31, 2022

(65) Prior Publication Data

US 2023/0187242 A1 Jun. 15, 2023

Related U.S. Application Data

(60) Provisional application No. 63/289,258, filed on Dec. 14, 2021.

(51) Int. Cl.
H01L 21/67 (2006.01)
G01N 21/88 (2006.01)
G01N 21/95 (2006.01)
G02B 5/18 (2006.01)
G02B 5/30 (2006.01)

(52) U.S. Cl.
CPC ... *H01L 21/67288* (2013.01); *G01N 21/8806* (2013.01); *G01N 21/9501* (2013.01); *G02B 5/1814* (2013.01); *G02B 5/1819* (2013.01); *G02B 5/1833* (2013.01); *G02B 5/3083* (2013.01); *G02B 5/3091* (2013.01); *G01N 2021/8848* (2013.01)

(58) Field of Classification Search
CPC .......... H01L 21/67288; G01N 21/8806; G01N 21/9501; G01N 2021/8848; G01N 21/95623; G02B 5/1814; G02B 5/1819; G02B 5/1833; G02B 5/3083
See application file for complete search history.

(56) References Cited

U.S. PATENT DOCUMENTS 6,563,582 B1 5/2003 Chun
10,942,135 B2 3/2021 Leong et al.
(Continued)

FOREIGN PATENT DOCUMENTS

CN 110806266 A * 2/2020
WO 2010102643 A1 9/2010

OTHER PUBLICATIONS

English Translation of Li et al. (CN110806266A) Description (Year: 2020).*
(Continued)

*Primary Examiner* — Tarifur R Chowdhury
*Assistant Examiner* — Akbar H. Rizvi
(74) *Attorney, Agent, or Firm* — Huse IP Law

(57) ABSTRACT

An optical inspection system includes one or more gratings to convert the polarization of light scattered from a target from an elliptical polarization that varies spatially across a collection pupil to a linear polarization that is uniformly oriented across the collection pupil. The one or more gratings have phase retardation that varies spatially across the collection pupil in accordance with the elliptical polarization. The one or more gratings include at least one grating on a reflective substrate. The optical inspection system also includes a linear polarizer to filter out the linearly polarized light.

21 Claims, 23 Drawing Sheets

(56) References Cited

U.S. PATENT DOCUMENTS

| | | | |
|---|---|---|---|
| 10,948,423 B2 | 3/2021 | Liu et al. | |
| 2003/0142288 A1 | 7/2003 | Kinrot et al. | |
| 2004/0095637 A1 | 5/2004 | Nikolov et al. | |
| 2007/0132987 A1 | 6/2007 | Haller et al. | |
| 2007/0139771 A1* | 6/2007 | Wang | G02B 5/3083 359/485.05 |
| 2009/0128911 A1 | 5/2009 | Itzkovitch et al. | |
| 2010/0188748 A1* | 7/2010 | Mizuta | G02B 1/02 359/486.01 |
| 2012/0092770 A1 | 4/2012 | Li et al. | |
| 2012/0194912 A1* | 8/2012 | Faraon | G02B 5/1819 359/573 |
| 2012/0300311 A1 | 11/2012 | Simmonds et al. | |
| 2013/0077040 A1* | 3/2013 | Escuti | G02B 5/3083 427/508 |
| 2014/0361152 A1 | 12/2014 | Maleev et al. | |
| 2015/0212011 A1 | 7/2015 | Lombez et al. | |
| 2016/0154229 A1 | 6/2016 | Milner et al. | |
| 2018/0292574 A1 | 10/2018 | Maleev et al. | |
| 2018/0364177 A1* | 12/2018 | Liu | G01N 21/21 |
| 2019/0137777 A1 | 5/2019 | Yang et al. | |
| 2020/0116626 A1* | 4/2020 | Hovorka | G01N 21/211 |
| 2020/0158943 A1 | 5/2020 | Calafiore | |
| 2020/0200954 A1 | 6/2020 | Mossberg et al. | |
| 2021/0273204 A1 | 9/2021 | Xu et al. | |
| 2021/0373324 A1* | 12/2021 | Jarvenpaa | G02B 27/0081 |
| 2022/0268710 A1 | 8/2022 | Liu et al. | |
| 2023/0014790 A1 | 1/2023 | Koshelev et al. | |

OTHER PUBLICATIONS

PCT/US2022/052063, International Search Report, Apr. 21, 2023.
PCT/US2022/052063, Written Opinion of the International Searching Authority, Apr. 21, 2023.
B. Paivanranta et al., "Low-cost fabrication of form-birefringent quarter-wave plates," Optics Express vol. 16, Issue 21, pp. 16334-16342 (2008).
Edmund Optics, "Understanding Waveplates and Retarders," available at https://www.edmundoptics.com/knowledge-center/application-notes/optics/understanding-waveplates (downloaded Jan. 19, 2022).
I. Richter et al., "Design considerations of form birefringent microstructures," Applied Optics vol. 34, Issue 14, pp. 2421-2429 (1995).
M. Born & E. Wolf, Principles of Optics, 15.5.2 Form birefringence, pp. 837-840 (60th anniv. ed. 2019).
Photonic Lattice, Inc., "Our Technology," available at https://www.photonic-lattice.com/en/our-technology/ (downloaded Jan. 19, 2022).
Born & Wolf, Principles of Optics, pp. 820-821 (Cambridge University Press, 7th ed., 2019).
Fowles, Introduction to Modern Optics, pp. 32-33 (Dover Publications, Inc., 2nd ed., 1989).
Thorlabs, "Zero-Order Vortex Half-Wave Retarders," https://www.thorlabs.com/newgrouppage9.cfm?objectgroup_id=9098 (accessed Nov. 6, 2024).
Zhang et al., "Performance evaluation for imaging with a vortex half-wave retarder," Proc. SPIE 11548, Optical Design and Testing X, 1154818 (Oct. 10, 2020); doi: 10.1117/12.2573321.
Gertus et al., "Laser beam shape converter using spatially variable waveplate made by nanogratings inscription in fused silica," Proc. of SPIE vol. 9343, 93431S (2015).
U.S. Appl. No. 17/829,289, Non-Final Office Action, Nov. 20, 2024.
U.S. Appl. No. 17/829,289, Final Office Action, Mar. 26, 2025.

* cited by examiner

REFLECTIVE WAVEPLATES FOR PUPIL POLARIZATION FILTERING

RELATED APPLICATION

This application claims the benefit of and priority to U.S. Provisional Patent Application No. 63/289,258, filed on Dec. 14, 2021, which is incorporated by reference in its entirety for all purposes.

TECHNICAL FIELD

This disclosure relates to waveplates, and more specifically to using waveplates to suppress surface scattering from inspection targets (e.g., semiconductor wafers).

BACKGROUND

Waveplates, which provide phase retardation for light passing through them, can be made using birefringent materials such as crystal quartz. Waveplates with 90 degrees of phase retardation (i.e., quarter-wave plates) or 180 degrees of phase retardation (i.e., half-wave plates) are commonly available from optical component suppliers. These types of waveplates are monolithic and have uniform phase retardation over the entire clear aperture of the component.

For wafer inspection applications, however, it is desirable to have varying phase retardation across the clear aperture of the component so that wafer surface scattering can be suppressed more efficiently. Various methods have been proposed to manufacture waveplates with spatially varying phase retardations by using either piece-wise quartz or a free-form surface shape with varying quartz thickness to achieve arbitrary control of phase retardation.

Strong suppression of surface scattering (i.e., strong haze suppression) involves precise control of phase retardation. The polarization of surface scattering at higher scattering angles is elliptical. The surface-scattering polarization should be uniformly linearized in order to achieve a high degree of suppression. It is difficult to achieve such precise phase-retardation control with conventional waveplates. For example, it is difficult to achieve high-precision control of wavefront error for the surface profile using free-form polishing. Another challenge of using conventional birefringent material as a waveplate is that the optical-axis angle is fixed, such that multiple segments are used to transform both polarization ellipticity and polarization orientation. Stitching multiple segments provides some control of optical-axis orientation, but fine control requires a large number of segments, which are difficult to integrate into one piece while maintaining high wavefront quality.

Phase retardation may also be achieved using form birefringence, a phenomenon in which an anisotropic structure such as a grating introduces a phase difference between two orthogonal electric fields (e.g., the electric fields parallel and perpendicular to the grating lines) of the transmitted zero-order light. Waveplates that use form birefringence are commercially available, often labeled as photonic crystals. The gratings of such waveplates are manufactured by conformal multi-layer thin film deposition on a corrugated substrate engraved with trenches. The optical-axis angle is controlled by the orientation of the grooves (i.e., of the trenches engraved in the substrate), while the phase retardation is controlled by the multi-layer films. Spatially varying waveplates can then be made by patterning miniature components on a monolithic substrate. With each component being as small as a few microns, such a pixelated device can emulate a nearly continuously spatially varying waveplate. The optical-axis orientation can also be made to vary continuously, though limited to certain simple patterns. There are limitations, however, on such devices. First, such a device is manufactured by a thin-film coating process. The thin films used for manufacturing such a device are generally not transparent in very short wavelengths. Second, multilayer thin films (e.g., of approximately 100 layers, as typically used for such waveplates) are difficult to manufacture because they require precise control of layer thickness and layer-to-layer shape or form.

It may be desirable to use ultraviolet light to inspect a target, because shorter wavelengths generally provide higher inspection sensitivity. Amorphous $SiO_2$ is transparent down to a wavelength of 130 nm. A form-birefringent quarter-wave plate manufactured on an $SiO_2$ substrate has been demonstrated using e-beam lithography and wet etch.

SUMMARY

Spatially varying waveplates with control of both the optical axis and phase retardation are valuable technologies for optical inspection systems. These technologies are particularly valuable at short (e.g., ultraviolet, such as deep ultraviolet (DUV) or vacuum ultraviolet (VUV)) inspection wavelengths. Such waveplates may be implemented using form-birefringence achieved with single-material gratings and/or with gratings on reflective substrates, in accordance with some embodiments.

In some embodiments, an optical inspection system includes one or more single-material gratings to convert the polarization of light scattered from a target from an elliptical polarization that varies spatially across a collection pupil to a linear polarization that is uniformly oriented across the collection pupil. The one or more single-material gratings have phase retardation that varies spatially across the collection pupil in accordance with the elliptical polarization. The optical inspection system also includes a linear polarizer to filter out the linearly polarized light.

In some embodiments, a method includes illuminating a target and collecting light scattered from the illuminated target. The collected light scattered from the illuminated target has an elliptical polarization that varies spatially across a collection pupil. The method also includes using one or more single-material gratings to convert the polarization of the collected light from the elliptical polarization that varies spatially across the collection pupil to a linear polarization that is uniformly oriented across the collection pupil. The one or more single-material gratings have phase retardation that varies spatially across the collection pupil in accordance with the elliptical polarization. The method further includes using a linear polarizer to filter out the light having the linear polarization that is uniformly oriented across the collection pupil.

In some embodiments, an optical inspection system includes one or more gratings to convert the polarization of light scattered from a target from an elliptical polarization that varies spatially across a collection pupil to a linear polarization that is uniformly oriented across the collection pupil. The one or more gratings have phase retardation that varies spatially across the collection pupil in accordance with the elliptical polarization. The one or more gratings include at least one grating on a reflective substrate. The optical inspection system also includes a linear polarizer to filter out the linearly polarized light.

In some embodiments, a method includes illuminating a target and collecting light scattered from the illuminated target. The collected light scattered from the illuminated target has an elliptical polarization that varies spatially across a collection pupil. The method also includes using one or more gratings to convert the polarization of the collected light from the elliptical polarization that varies spatially across the collection pupil to a linear polarization that is uniformly oriented across the collection pupil. The one or more gratings have phase retardation that varies spatially across the collection pupil in accordance with the elliptical polarization. The one or more gratings include at least one grating on a reflective substrate. The method further includes using a linear polarizer to filter out the light having the linear polarization that is uniformly oriented across the collection pupil.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
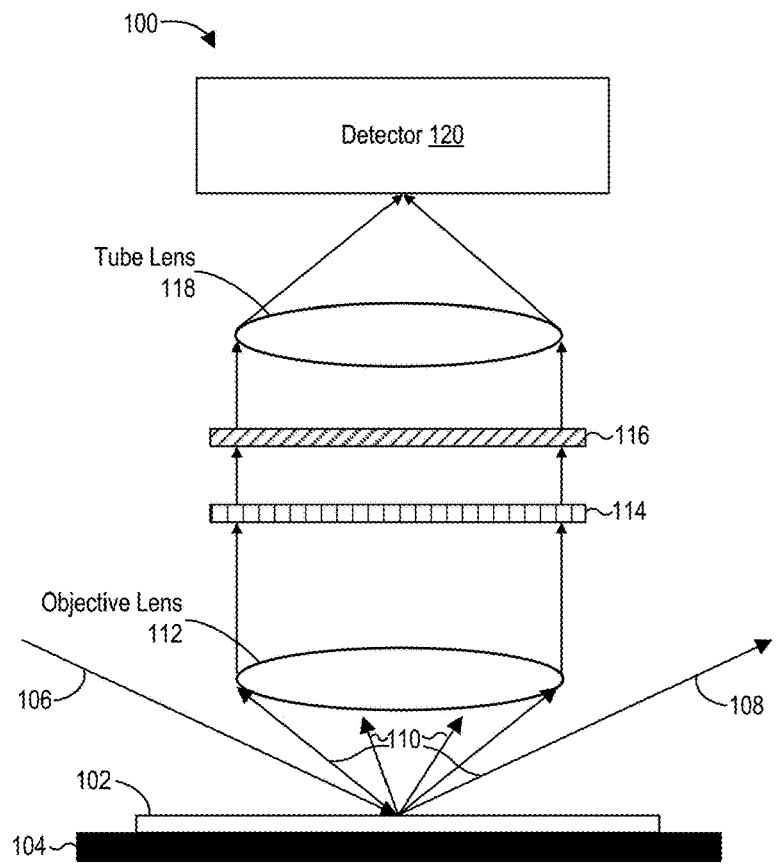
FIG. 1 is a cross-sectional view of a portion of an optical inspection system in accordance with some embodiments.

FIG. 1 is a cross-sectional view of a portion of an optical inspection system 100 in accordance with some embodiments. The optical inspection system 100 is used to inspect a target 102 for defects (e.g., for particles on it). In some embodiments, the target 102 is a semiconductor wafer (e.g., an unpatterned semiconductor wafer). For example, the target 102 is a polished semiconductor wafer on which semiconductor devices will be, but have not yet been, fabricated. The polished semiconductor wafer may be inspected for defects using the optical inspection system 100 before the fabrication process begins. The target 102 is mounted on a platform 104 (e.g., on a wafer chuck) for inspection.

During inspection, light 106 from a light source (not shown) illuminates the target 102 at an oblique angle. In some embodiments, the light 106 is ultraviolet. For example, the light 106 is deep ultraviolet (i.e., with a wavelength between 200-280 nm) or in an upper portion of the vacuum ultraviolet range (e.g., with a wavelength between 100-200 nm).

Some of the light 106 is reflected by the target 102 as reflected light 108. Some of the light 106, however, is scattered by the target 102 as scattered light 110. For example, a defect (e.g., a particle) on the surface of the target 102 will scatter light 106 as scattered light 110. Even in the absence of a defect, however, surface scattering (e.g., due to surface roughness for the target 102) of some of the light 106 occurs, producing scattered light 110. The scattered light 110, which scatters off of the surface of the target 102 at various scattering angles, is collected by an objective lens 112. The scattered light 110 is collected within a collection pupil. Scattered light 110 that results from surface scattering, as opposed to scattering by a defect, is a source of noise that reduces the signal-to-noise ratio for defect detection by the optical inspection system 100. Accordingly, it is desirable to filter out scattered light 110 resulting from surface scattering before it reaches the detector 120 used for defect detection.

The scattered light 110 resulting from surface scattering, as collected by the objective lens 112, has an elliptical polarization that varies spatially across the collection pupil. The elliptical polarization may vary in both magnitude and orientation across the collection pupil. For a given type of target 102, however, the elliptical polarization does not vary significantly (at least in orientation) from target 102 to target 102 (i.e., between different instances of the target 102). Thus, targets 102 of a particular type have scattered light 110 from surface scattering with elliptical polarization of substantially the same orientation at a given point in the collection pupil, although the elliptical polarization (including its orientation) varies spatially across the collection pupil for the targets 102. For example, if targets 102 are semiconductor wafers (e.g., polished semiconductor wafers) of a particular type (e.g., of a particular size, material, and/or manufacturer), the elliptical polarization of the scattered light 110 from surface scattering has substantially the same orientation at a given point in the collection pupil for all of the semiconductor wafers.

The objective lens 112 collimates the scattered light 110 and directs it to a grating 114. The grating 114 converts the polarization of the scattered light 110 produced by surface scattering from the target 102 from the elliptical polarization that varies spatially across the collection pupil to a linear polarization that is uniformly oriented across the collection pupil. The grating 114 achieves this result by having (i.e., by providing to the scattered light 110) phase retardation that varies spatially across the collection pupil in accordance with the elliptical polarization. The grating 114 is a transmissive optical component: scattered light 110 transmitted through the grating 114 has its polarization converted by the grating 114.

The grating 114 is disposed between the objective lens 112 and a linear polarizer 116 along the optic axis for the scattered light 110 as collected and collimated by the objective lens 112. The linear polarizer 116 has an orientation that allows it to filter out the scattered light 110 with the uniformly oriented linear polarization provided by the grating 114 and to transmit light with a polarization perpendicular to that linear polarization. Light 110 scattered by a defect (e.g., particle) has different polarization states than light 110 produced by surface scattering. The linear polarizer 116 thus filters out the scattered light 110 produced by surface scattering from the target 102 while transmitting at least some of the scattered light 110 produced by scattering from a defect on the target 102. The latter scattered light 110 is focused by a tube lens 118 onto a detector 120 (e.g., a digital camera) used for defect detection. The linear polarizer 116 is disposed between the grating 114 and the tube lens 118 along the optic axis for the scattered light 110. The tube lens 118 is disposed between the linear polarizer 116 and the detector 120 along the optic axis for the scattered light 110. The optical inspection system 100 may also include other optical components (not shown) (e.g., for directing and/or focusing light).

Figure 2:
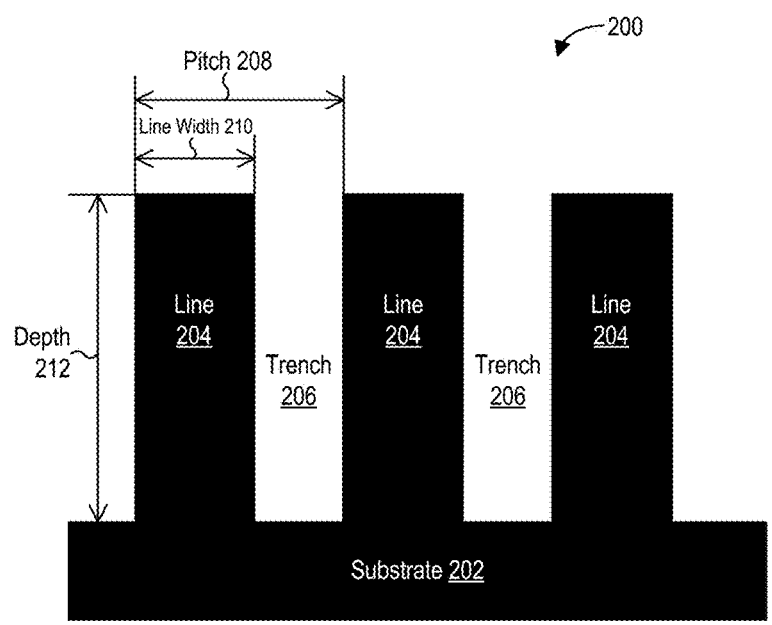
FIG. 2 is a cross-sectional view of an example of the grating in the optical inspection system of FIG. 1, in accordance with some embodiments.

FIG. 2 is a cross-sectional view of a grating 200 that is an example of the grating 114 (FIG. 1) in accordance with some embodiments. The grating 200, which is on a substrate 202, is a waveplate with phase retardation based on form birefringence: the grating 200 is an artificial anisotropic structure with form birefringence, whereas the substrate 202 is not birefringent, in accordance with some embodiments. The grating 200 includes a series of lines 204 on the substrate 202. Successive lines 204 in the series are separated by respective trenches 206. The lines 204 and trenches 206 extend in a direction out of (or equivalently, into) the page for FIG. 2. The lines 204 and trenches 206 thus are parallel to an axis perpendicular to the page of FIG. 2 and perpendicular to the horizontal axis of FIG. 2. The grating 200 therefore is a one-dimensional grating.

The distance between (i.e., spacing of) successive lines 204 is the pitch 208. The lines 204 have a line width 210. The trenches 206 have a depth 212.

The lines 204 are composed of a single material (e.g., glass), which may be the same material as the substrate 202. The grating 200 may be formed by etching the trenches 206 into the substrate 202 or by selective growth of the lines 204 on the substrate 202. The lines 204 and substrate 202 may be any materials that are transparent to the wavelength of the scattered light 110 (e.g., may be insulators, and thus dielectric materials, that are transparent to the wavelength of the scattered light 110). In some embodiments, the single material for the lines 204 is $SiO_2$ (i.e., silicon dioxide) (e.g., fused silica) and the substrate 202 may also be $SiO_2$ (e.g., fused silica). In some other embodiments, the single material for the lines 204 is sapphire and the substrate 202 may also be sapphire. Sapphire has a higher index of refraction than $SiO_2$ and therefore provides stronger phase retardation with a smaller depth 212 than $SiO_2$. In yet some other embodiments, the single material for lines 204 is calcium fluoride ($CaF_2$) and the substrate 202 may also be $CaF_2$.

Figure 3A:
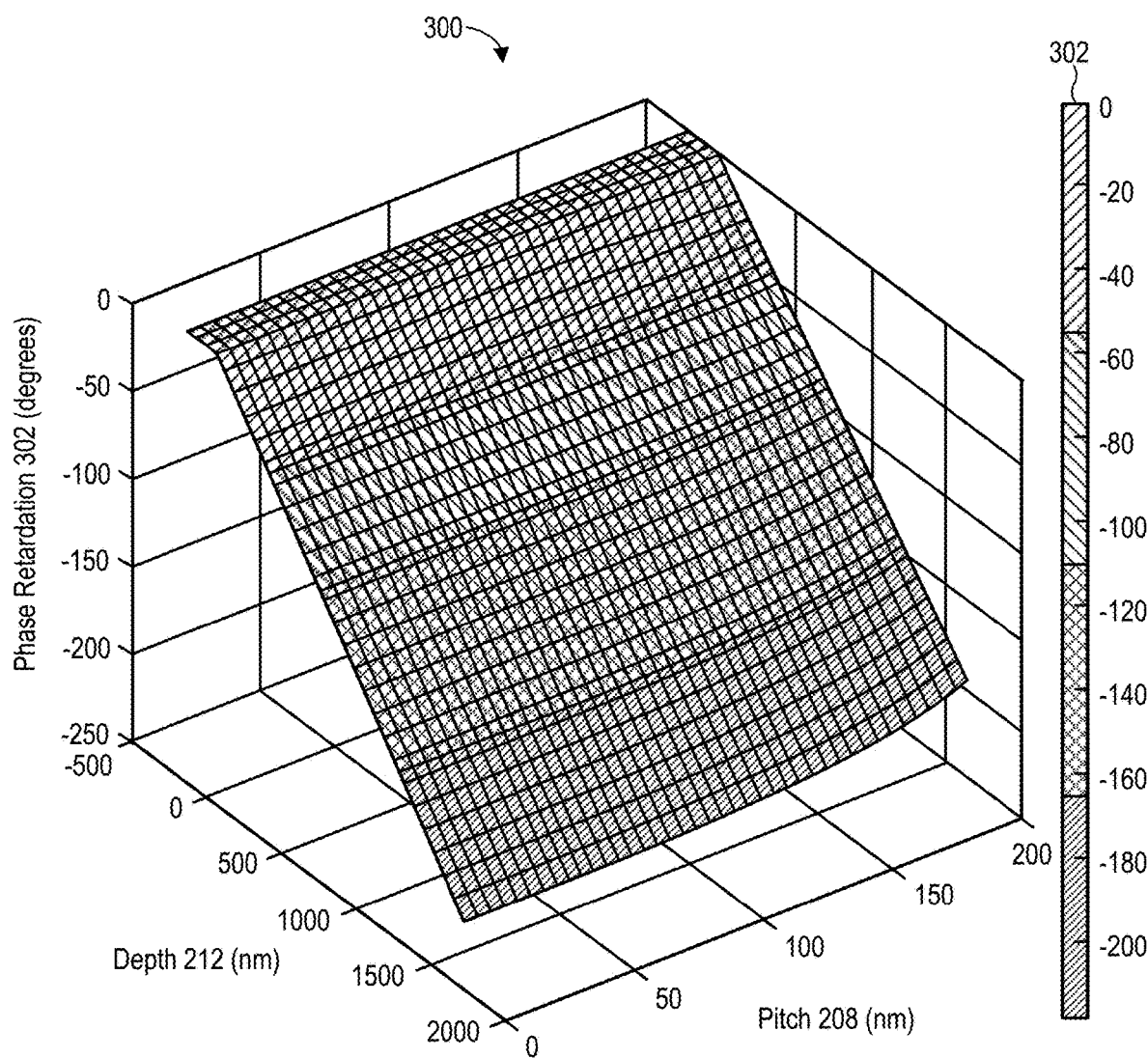
FIGS. 3A-3D are graphs showing how phase retardation for the grating of FIG. 2 depends on the grating's pitch, depth, and duty cycle.
Figure 3B:
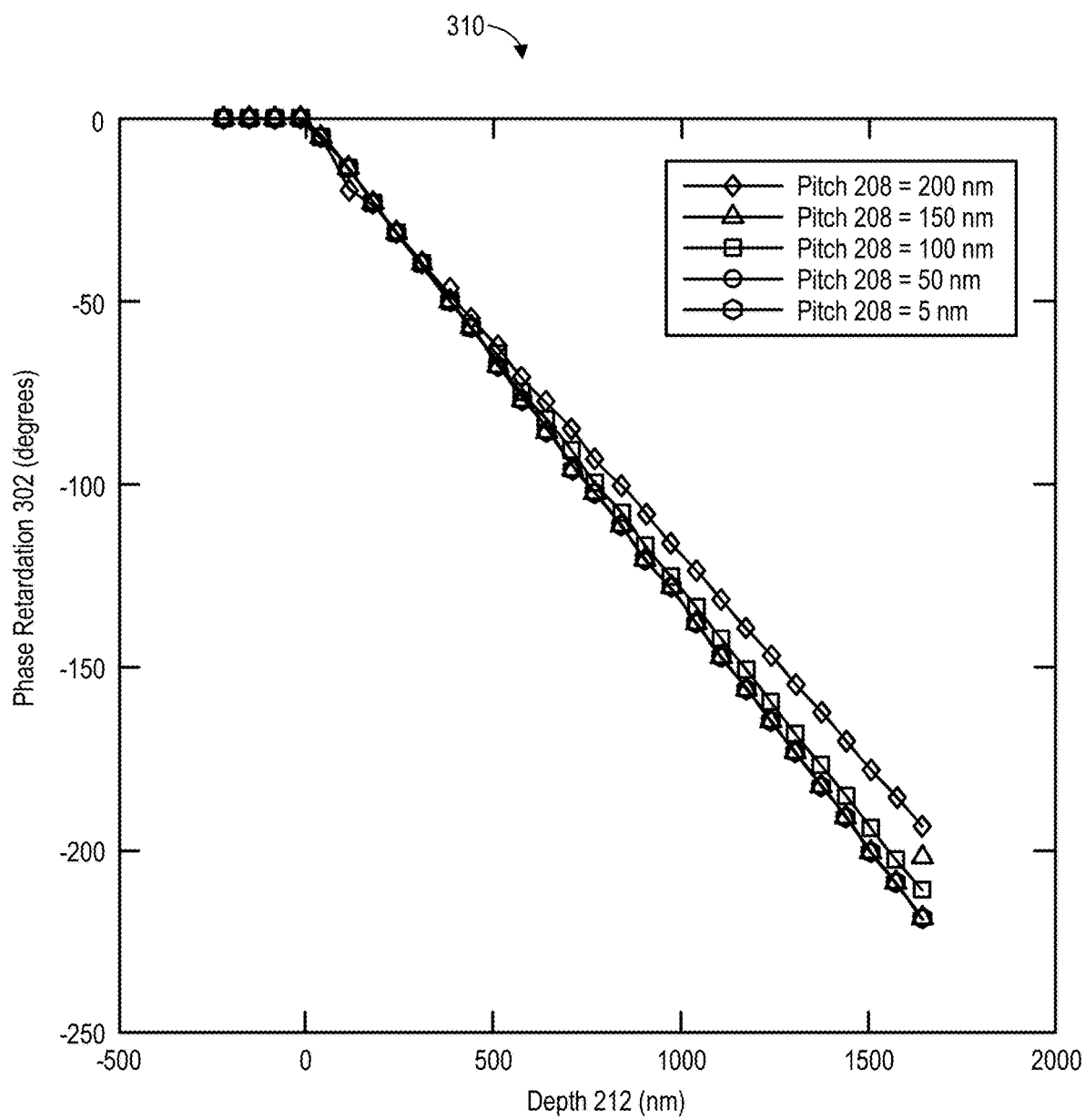
Figure 3C:
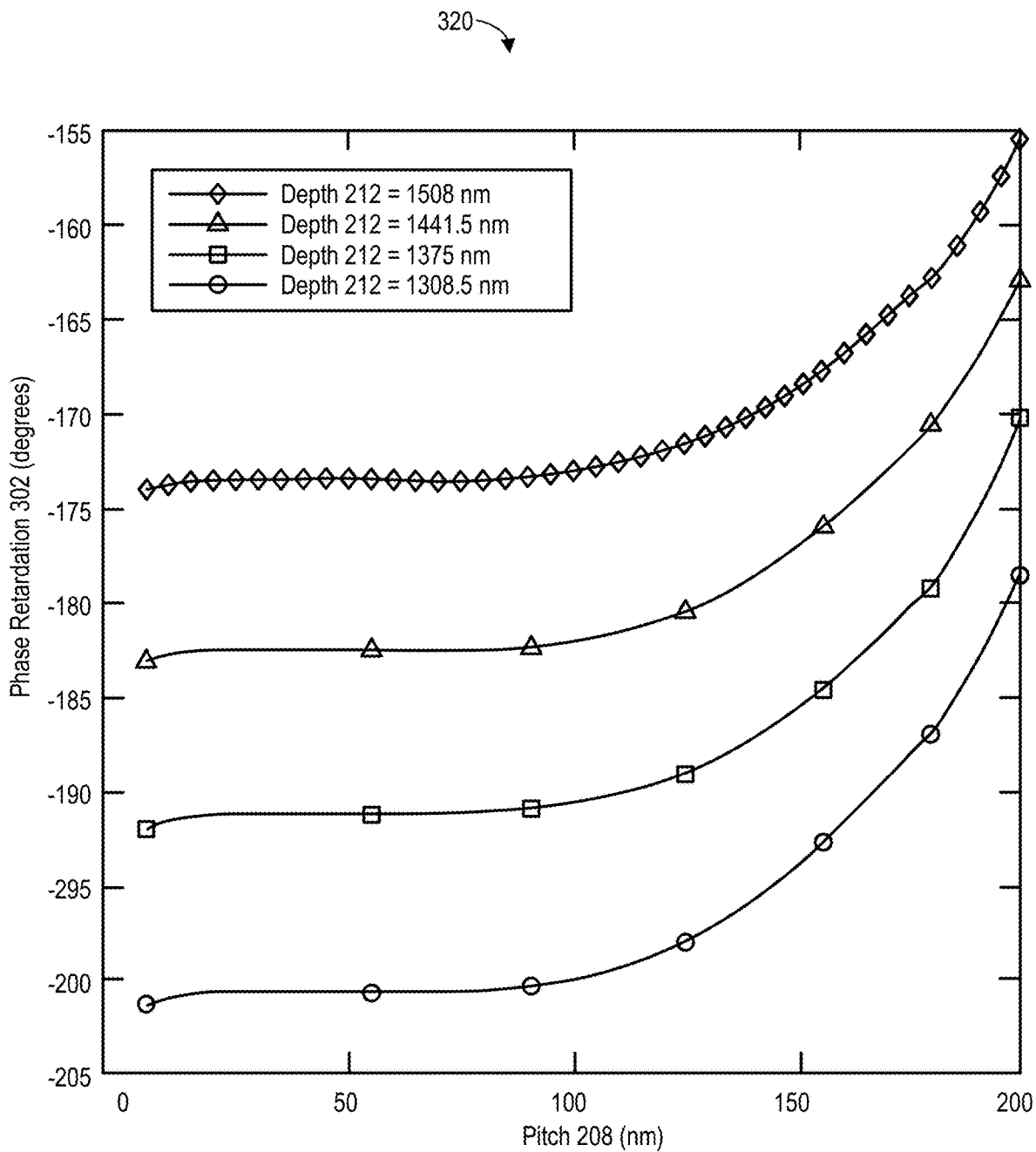
Figure 3D:
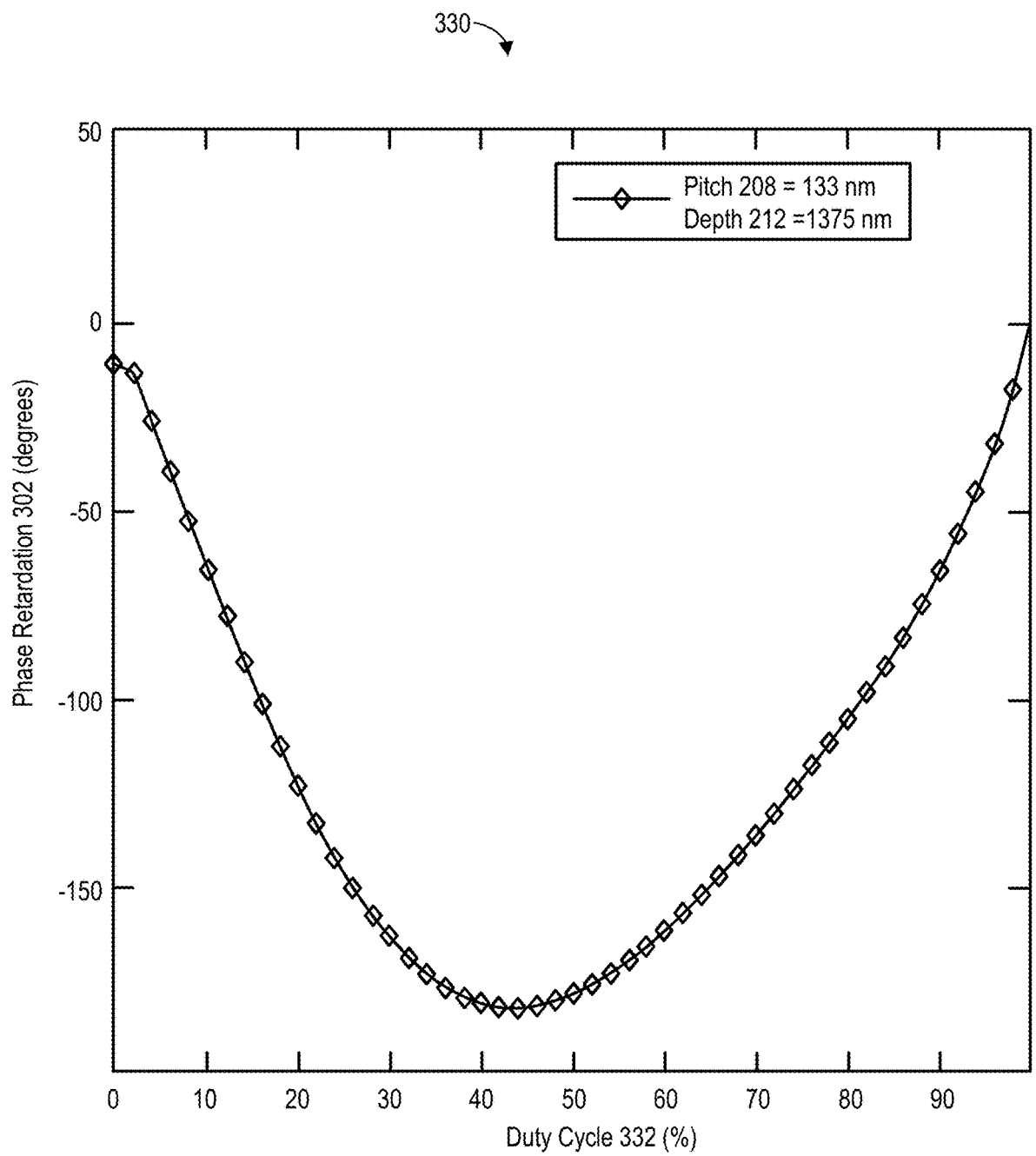

The effective dielectric constant for electric fields parallel to the lines 204 and trenches 206 is:

$$\varepsilon_{\parallel} = \frac{\varepsilon_1 \varepsilon_0}{(1-f)\varepsilon_1 + f\varepsilon_0} \quad (1)$$

and the effective dielectric constant for electric fields perpendicular to the lines 204 and trenches 206 is:

$$\varepsilon_{\perp} = f\varepsilon_1 + (1-f)\varepsilon_0 \quad (2)$$

where $\varepsilon_1$ is the dielectric constant of the lines 204 (and may also be the dielectric constant of the substrate 202), $\varepsilon_0$ is the dielectric constant of the trenches 206 (e.g., of air), and f is the duty cycle of the grating 200. The duty cycle equals the ratio of the line width 210 to the pitch 208; the duty cycle thus equals zero in the absence of the lines 204 and equals one in the absence of the trenches 206. The difference in refractive index difference between these two orthogonal polarizations (i.e., the difference between $\varepsilon_{\parallel}$ and $\varepsilon_{\perp}$) is thus a function of $\varepsilon_1$ and f. The difference reaches a maximum when the duty cycle is around 50% (e.g., between 40% and 50%, as shown in FIG. 3D).

Knowing $\varepsilon_{\parallel}$ and $\varepsilon_{\perp}$, the phase retardation for the grating 200 may be calculated using well-known physics. FIGS. 3A-3D are graphs showing how phase retardation 302 for the grating 200 depends on the pitch 208, depth 210, and duty cycle f, for 266 nm light. FIG. 3A is a graph 300 showing variation of the phase retardation 302 as a function of the pitch 208 and depth 212. FIG. 3B is a graph 310 showing variation of the phase retardation 302 as a function of the depth 212 for different fixed values of the pitch 208. FIG. 3C is a graph 320 showing variation of the phase retardation 302 as a function of the pitch 208 for different fixed values of the depth 212. FIG. 3D is a graph 330 showing variation of the phase retardation 302 as a function of the duty cycle 332 (i.e., duty cycle f) for fixed values of the pitch 208 and depth 212.

The difference in refractive index between these two orthogonal polarizations (i.e., between $\varepsilon_\parallel$ and $\varepsilon_\perp$) for the grating 200 is typically much larger than the difference in refractive index for orthogonal polarizations for a naturally birefringent material. The depth 212 for achieving a certain phase shift with a grating 200 therefore is much smaller than the thickness of a natural birefringent waveplate that achieves that phase shift. The depth 212 for achieving a half-wave phase shift (i.e., for implementing a half-wave plate using the grating 200) is still rather large compared to the grating pitch 208. For example, at a wavelength of 266 nm for the light 106 and scattered light 110, using fused silica as the substrate 202 and lines 204, the depth 212 for a half-wave plate is about 1.4 um. The pitch 208 should be small enough to avoid generating propagating orders, that is, less than the wavelength divided by the refractive index (i.e., the square root of the dielectric constant) of the substrate 202:

$$\text{pitch} < \lambda/\sqrt{\varepsilon} \tag{3}$$

The minimum aspect ratio for 180° phase retardation at DUV to VUV wavelengths is 16:1. The minimum aspect ratio is also dependent on wavelength and tends to decrease with shorter wavelengths.

A closed-form solution for the optical-axis angle (i.e., orientation) and phase retardation of a waveplate implemented using a grating 200 (FIG. 2) to linearize the polarization of elliptically polarized scattered light 110 may be derived using a Jones matrix. Such a waveplate with arbitrary optical-axis angle and phase retardation is described by a Jones matrix:

$$J = \begin{bmatrix} \cos\theta & -\sin\theta \\ \sin\theta & \cos\theta \end{bmatrix} \begin{bmatrix} 1 & 0 \\ 0 & e^{-j\phi} \end{bmatrix} \begin{bmatrix} \cos\theta & \sin\theta \\ -\sin\theta & \cos\theta \end{bmatrix} = \begin{bmatrix} \cos\frac{\phi}{2} + j\sin\frac{\phi}{2}\cos2\theta & j\sin\frac{\phi}{2}\sin2\theta \\ j\sin\frac{\phi}{2}\sin2\theta & \cos\frac{\phi}{2} - j\sin\frac{\phi}{2}\cos2\theta \end{bmatrix} \tag{4}$$

where $\phi$ is the phase retardation and $\theta$ is the optical-axis angle (defined as parallel to grating lines 204) of the waveplate. The optical-axis angle is indicative of the orientation of the grating 200. An arbitrary input polarization (i.e., a polarization of light incident on the waveplate) with an amplitude ratio of r and phase difference of $\delta$ is transformed by the waveplate to a different polarization state:

$$\begin{bmatrix} E'_x \\ E'_y \end{bmatrix} = \begin{bmatrix} \cos\frac{\phi}{2} + j\sin\frac{\phi}{2}\cos2\theta & j\sin\frac{\phi}{2}\sin2\theta \\ j\sin\frac{\phi}{2}\sin2\theta & \cos\frac{\phi}{2} - j\sin\frac{\phi}{2}\cos2\theta \end{bmatrix} \begin{bmatrix} 1 \\ re^{j\delta} \end{bmatrix} \tag{5}$$

To transform an arbitrary scattering polarization into x-polarization (and thus into a linear polarization), the y-component of the light is set to zero:

$$E'_y = j\sin\frac{\phi}{2}\sin2\theta + r(\cos\delta + j\sin\delta)\left(\cos\frac{\phi}{2} - j\sin\frac{\phi}{2}\cos2\theta\right) = 0 \tag{6}$$

where the x-component is parallel to the plane of incidence and the y-component is perpendicular to the plane of incidence. The optical-axis angle and the phase retardation of the waveplate are then given by:

$$\cot2\theta = \frac{\cos\delta}{r} \tag{7a}$$

$$\cot\frac{\phi}{2} = -\tan\delta\cos2\theta. \tag{7b}$$

Both r and $\delta$ vary with scattering angle. They therefore are functions of collection-pupil position. The optical-axis angle and phase retardation also are functions of collection-pupil position.

Similarly, an arbitrary scattering polarization can be transformed into y-polarization (and thus into a linear polarization) by setting the x-component of the light to zero:

$$E'_x = \cos\frac{\phi}{2} + j\sin\frac{\phi}{2}\cos2\theta + j\sin\frac{\phi}{2}\sin2\theta re^{j\delta} = 0 \tag{8}$$

The optical-axis angle and the phase retardation of the waveplate are then given by:

$$\cot2\theta = -r\cos\delta \tag{9a}$$

$$\cot\frac{\phi}{2} = r\sin2\theta\sin\delta \tag{9b}$$

Equations 7a-7b and 9a-9b provide closed-form solutions for a single-piece waveplate based on a grating 200 (FIG. 2) to convert an arbitrarily distributed elliptical polarization over the collection pupil into a uniform linear polarization by aligning the local optical axis (and thus the grating orientation) and phase retardation accordingly. Both solutions achieve the same effect of converting varying elliptical polarization across the collection pupil into uniform linear polarization across the collection pupil. But depending on the polarization distribution of the surface scattering, one solution may be less demanding than the other in terms of the maximum phase shift, and thus may be easier to manufacture.

Figure 4A:
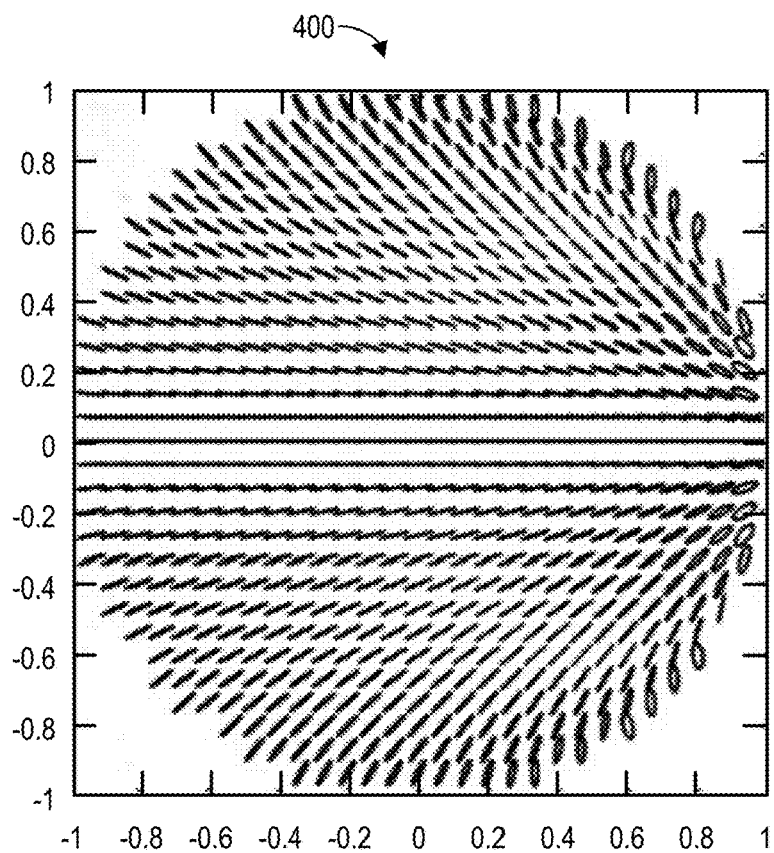
FIG. 4A is a map of an example of surface-scattering polarization across a collection pupil.
Figure 4B:
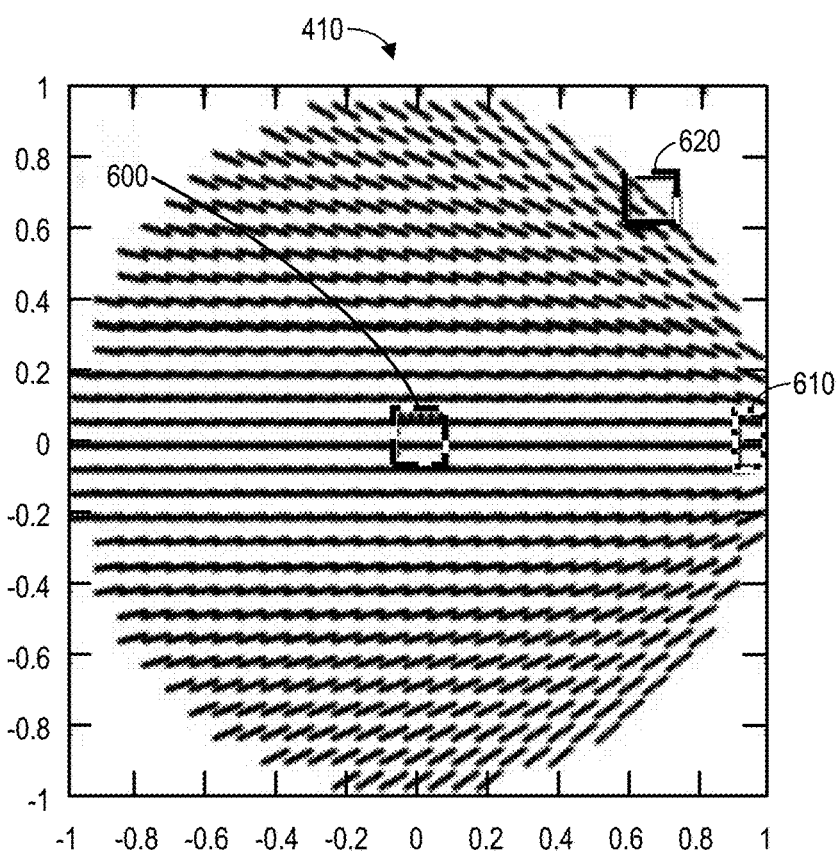
FIG. 4B is a map across the collection pupil of the optical axis of a waveplate with a grating that transforms the surface-scattering polarization of FIG. 4A into x-polarization.
Figure 4C:
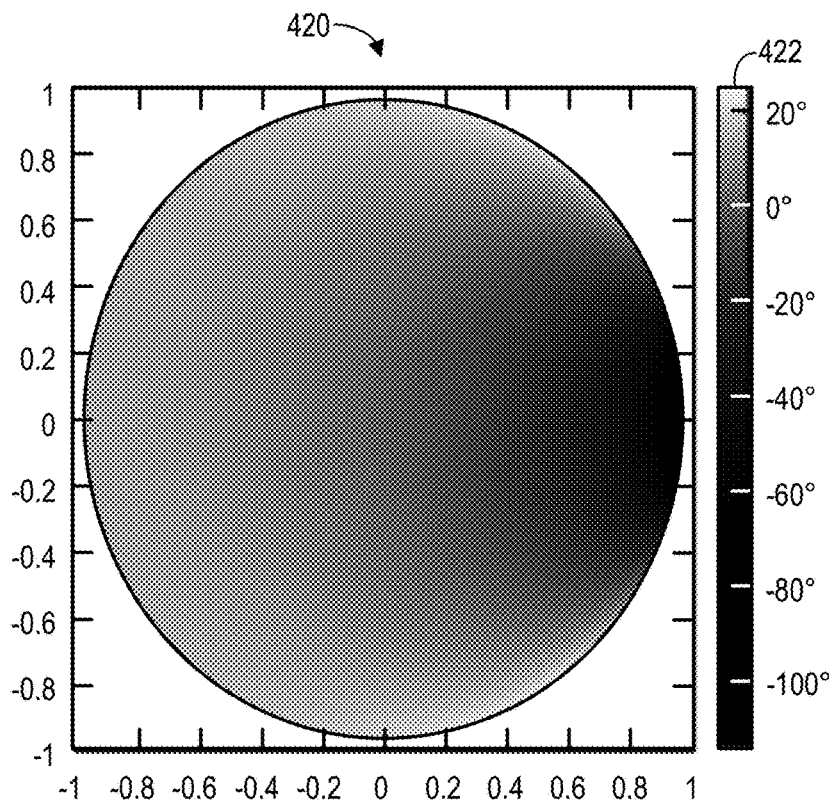
FIG. 4C is a map across the collection pupil of the phase retardation of the waveplate of FIG. 4B.
Figure 4D:
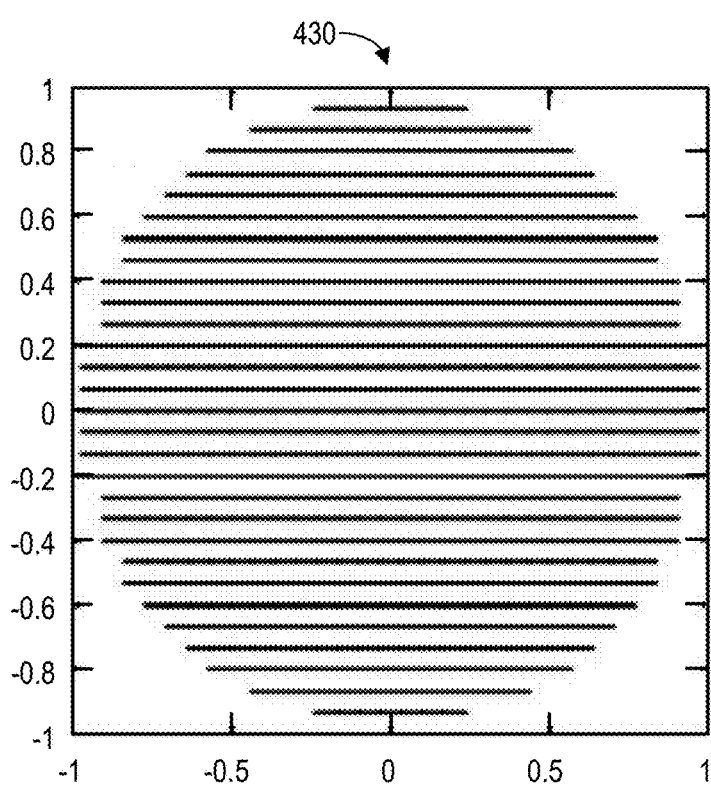
FIG. 4D is a map across the collection pupil of the output polarization after the scattered light produced by surface scattering passes through the waveplate of FIGS. 4B and 4C.

FIG. 4A is a map 400 of an example of surface-scattering polarization across a collection pupil. As FIG. 4A shows, the surface-scattering polarization varies spatially, including in its orientation, across the collection pupil. FIG. 4B is a map 410 across the collection pupil of the optical axis of a waveplate with a grating 200 that transforms the surface-scattering polarization of FIG. 4A into x-polarization (and thus into an example of uniformly linear polarization across the collection pupil), as determined based on equation 7a. The optical axis of the grating of FIG. 4B (and thus the orientation of the grating) varies spatially across the collection pupil, as shown. FIG. 4C is a map 420 across the collection pupil of the phase retardation 422 of the waveplate (i.e., the grating 200) of FIG. 4B as determined based on equation 7b. The phase retardation 422, which varies spatially across the collection pupil, is shown in FIG. 4C using a grayscale color bar with units of degrees. The phase retardation 422 is an example of phase retardation 302 (FIGS. 3A-3D). FIG. 4D is a map 430 across the collection pupil of the output polarization (i.e., the polarization of scattered light 110) after the scattered light 110 (FIG. 1) produced by surface scattering passes through the waveplate (i.e., the grating 200) of FIGS. 4B and 4C. As dictated by equations 7a and 7b, the output polarization is an x-polarization across the collection pupil (i.e., a uniform polarization in the x-direction) and thus is uniformly linear.

Figure 4E:
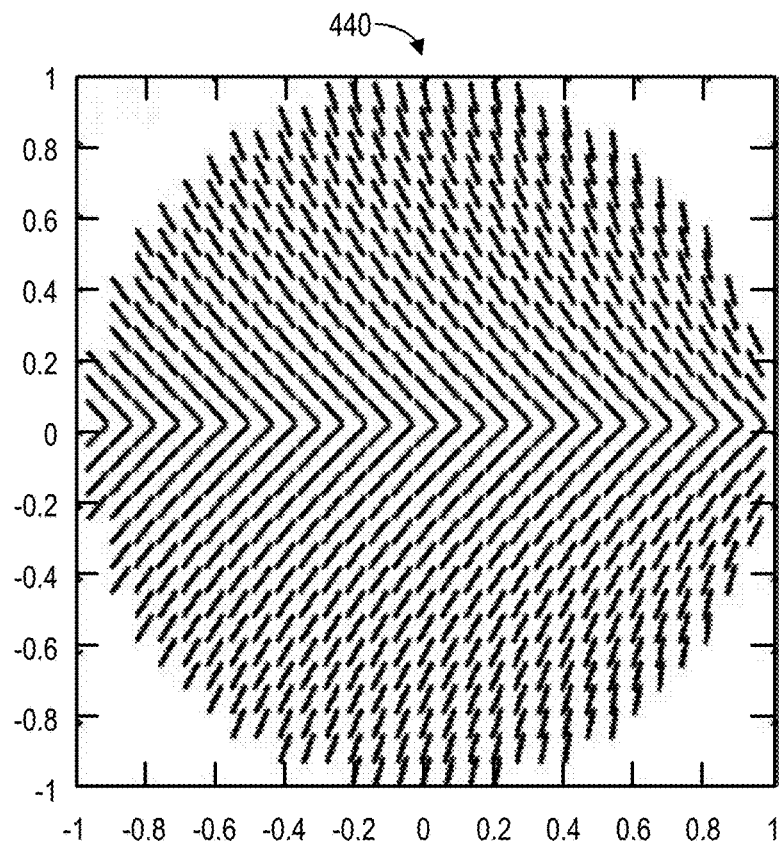
FIG. 4E is a map across the collection pupil of the optical axis of a waveplate with a grating that transforms the surface-scattering polarization of FIG. 4A into y-polarization.
Figure 4F:
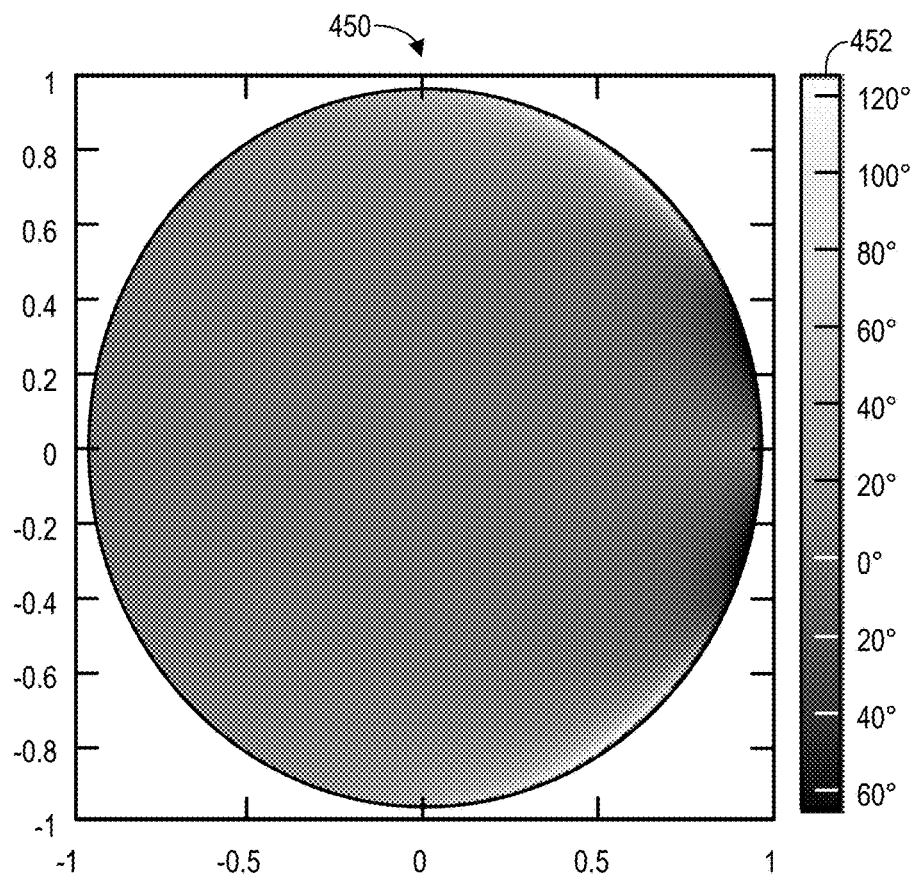
FIG. 4F is a map across the collection pupil of the phase retardation of the waveplate of FIG. 4E.
Figure 4G:
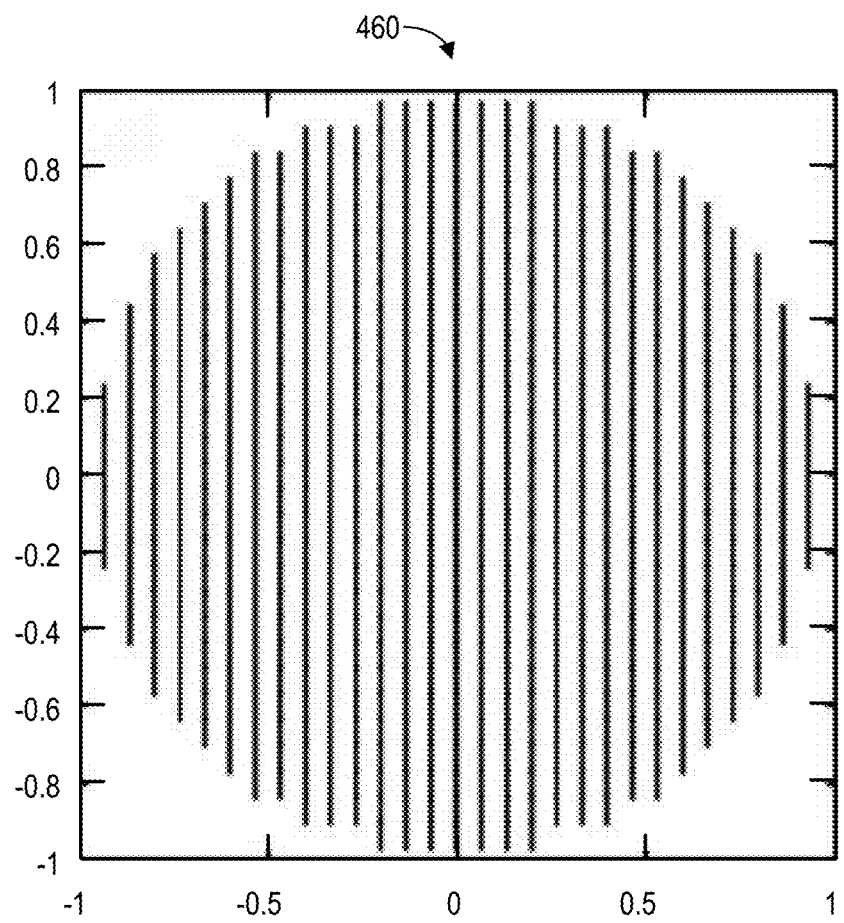
FIG. 4G is a map across the collection pupil of the output polarization after the scattered light produced by surface scattering passes through the waveplate of FIGS. 4E and 4F.

Similarly, FIG. 4E is a map 440 across the collection pupil of the optical axis of a waveplate with a grating 200 that transforms the surface-scattering polarization of FIG. 4A into y-polarization (and thus into another example of uniformly linear polarization across the collection pupil), as determined based on equation 9a. The optical axis of the grating of FIG. 4E (and thus the orientation of the grating) varies spatially across the collection pupil, as shown. FIG. 4F is a map 450 across the collection pupil of the phase retardation 452 of the waveplate (i.e., the grating 200) of FIG. 4E as determined based on equation 9b. The phase retardation 452, which varies spatially across the collection pupil, is shown in FIG. 4F using a grayscale color bar with units of degrees. A phase shift of pi has been subtracted from the phase-retardation map 450 (i.e., values of the phase retardation 452 have been reduced by 180°). The phase retardation 452 is an example of phase retardation 302 (FIGS. 3A-3D). FIG. 4G is a map 460 across the collection pupil of the output polarization (i.e., the polarization of scattered light 110) after the scattered light 110 (FIG. 1) produced by surface scattering passes through the waveplate (i.e., the grating 200) of FIGS. 4E and 4F. As dictated by equations 9a and 9b, the output polarization is a y-polarization across the collection pupil (i.e., a uniform polarization in the y-direction) and thus is uniformly linear.

Comparison of FIGS. 4C and 4F shows that, for the surface-scattering polarization of FIG. 4A, transforming the polarization into an x-polarization requires a lower maximum phase shift than transforming the polarization into a y-polarization. Use of a lower maximum phase shift can be advantageous because it eases manufacturing.

Figure 5:
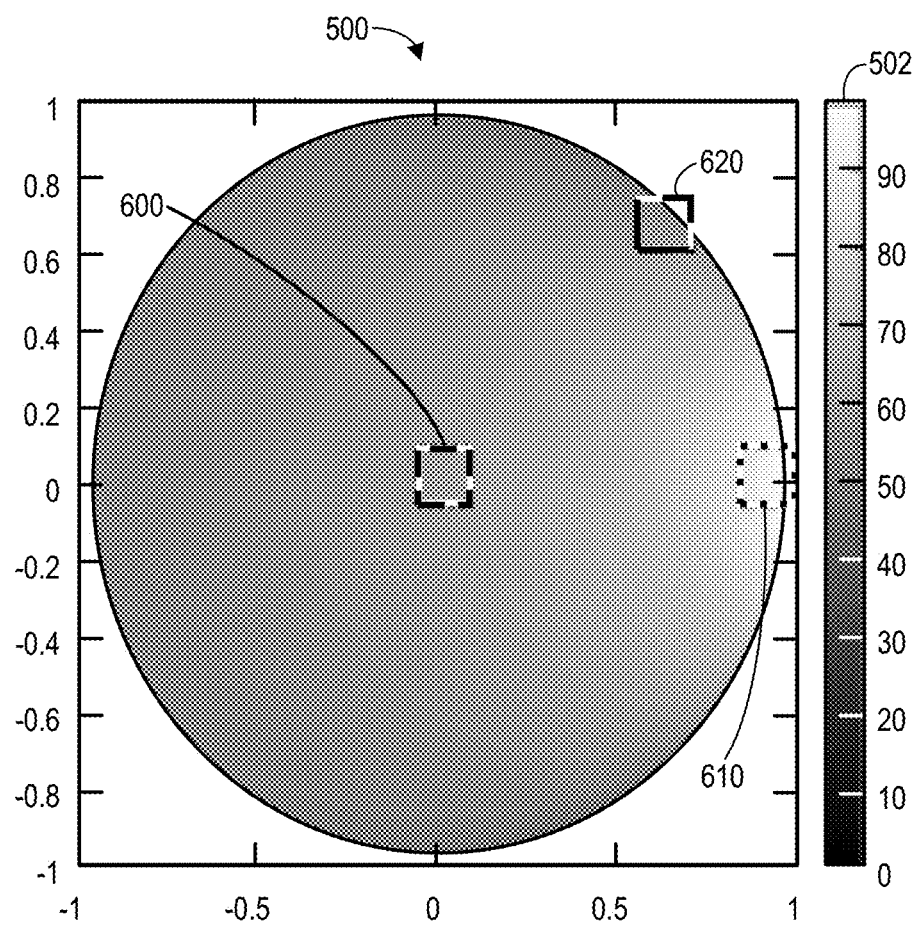
FIG. 5 is a map of variation of the duty cycle across the collection pupil for the waveplate of FIGS. 4B and 4C.

Phase retardation provided by a grating 200 (FIG. 2) increases nearly linearly with grating depth 212, as shown in FIGS. 3A and 3B. The grating depth 212 (FIG. 2) may be set to a fixed value (i.e., to a constant depth for the entire grating 200) corresponding to the middle of the range of phase retardation within the collection pupil. This fixed depth 212 provides constant phase retardation over the full collection pupil. More generally, the grating depth 212 of the grating 200 may be set to a fixed value for the entire waveplate (i.e., to a constant depth across the collection pupil), thus providing constant (i.e., uniform) phase retardation over the full collection pupil. In such embodiments, the phase variation (i.e., the variation in phase retardation) across the collection pupil is controlled by the grating duty cycle f (e.g., duty cycle 332, FIG. 3D), which varies spatially across the collection pupil (e.g., with a constant pitch 208). The values of the duty cycle may be calculated based on simulation of the dependence of the phase retardation on the duty cycle (e.g., as in FIG. 3D). FIG. 5 is a map 500 of variation of the duty cycle 502 across the collection pupil to achieve the phase retardation 422 of the map 420 (FIG. 4C), assuming a depth 212 of 1750 nm and a numerical aperture of 0.975. Values of the duty cycle 502 are shown in FIG. 5 using a grayscale color bar.

Figure 6C:
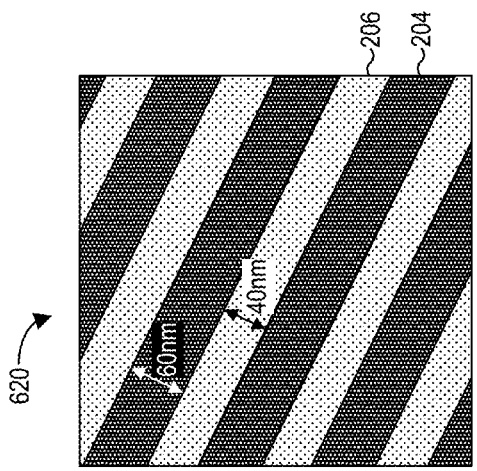
FIGS. 6A-6C are plan views of portions of the grating for the maps of FIGS. 4B-4D and 5, showing the grating orientation and duty cycle at three respective locations in the collection pupil.
Figure 6B:
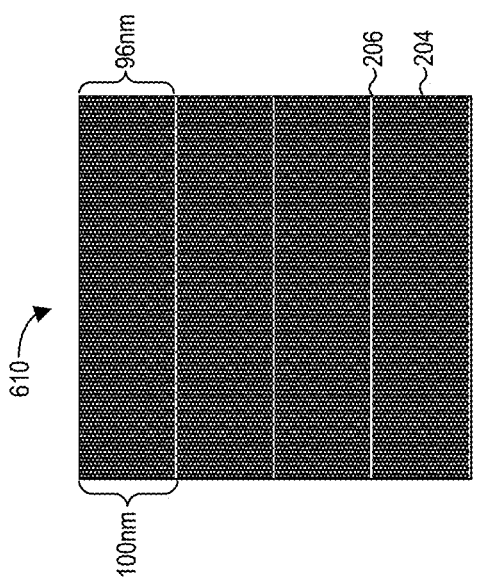
Figure 6A:
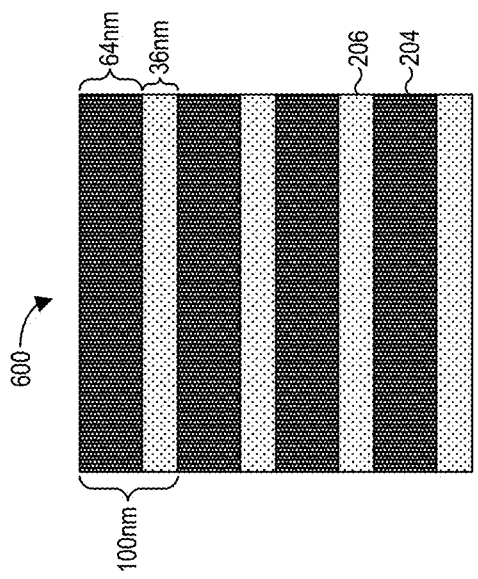

The designed pattern of such a waveplate with a grating 200 has both spatially varying grating orientation (e.g., as in FIG. 4B or 4E) and grating duty cycle (e.g., as in FIG. 5). FIGS. 6A-6C are plan views of portions of the grating 200 for the maps of FIGS. 4A-4D and 5. FIGS. 6A-6C show the grating orientation and duty cycle at three respective locations 600, 610, and 620 in the collection pupil. The locations 600, 610, and 620 are labeled in the maps 410 (FIG. 4B) and 500 (FIG. 5). The location 600 is in the center of the collection pupil, the location 610 is on the right of the collection pupil, and the location 620 is on the upper right of the collection pupil. The center location 600 has a horizontal grating orientation, a line width 210 of 64 nm, and a 64% duty cycle, as shown in FIG. 6A. The right location 610 has a horizontal grating orientation, a line width 210 of 96 nm, and a 96% duty cycle, as shown in FIG. 6B. The upper-right location 620 has a −40° grating orientation, a line width 210 of 60 nm, and a 60% duty cycle, as shown in FIG. 6C. The pitch 208 for all three locations 600, 610, and 620, and for the entire grating 200, is 100 nm. The grating 200 thus has a uniform pitch 208 in addition to a uniform depth 212. In other examples, the pitch 208 and/or depth 212 may be uniform for a grating 200 (and thus uniform across the collection pupil) but with different values, or may vary across the grating 200 (and accordingly, across the collection pupil)

To achieve the desired phase retardation, a single grating 200 to be used as a waveplate may have a high aspect ratio for at least some locations. For example, the aspect ratio is about 16:1 to achieve half-wave phase retardation (i.e., to implement a half-wave plate) for DUV to VUV light. To lower the aspect ratio and ease manufacturing, multiple gratings 200 (e.g., two gratings 200) may be used instead of a single grating 200. The multiple gratings 200, each of which is a separate waveplate, collectively convert the polarization of scattered light 110 produced by surface scattering off of a target 102 from an elliptical polarization that varies spatially across the collection pupil (including variation in its orientation) to a linear polarization that is uniformly oriented across the collection pupil. In some embodiments, each of the multiple gratings 200 is a one-dimensional grating. In addition to a relaxed requirement for the aspect ratio and thus for the duty cycle, multiple-grating designs also allow for other parameter choices that may further ease manufacturing of the gratings.

Figure 7:
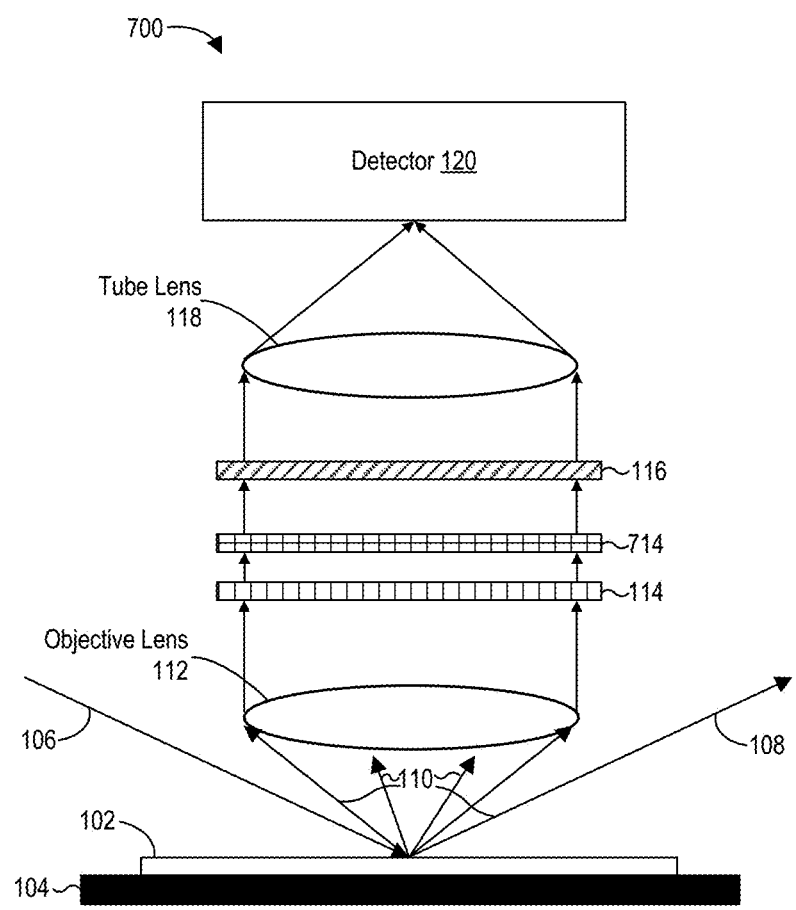
FIG. 7 is a cross-sectional view of a portion of an optical inspection system with two gratings that act as waveplates, in accordance with some embodiments.

FIG. 7 is a cross-sectional view of a portion of an optical inspection system 700 in accordance with some embodiments. Instead of a single grating 114, the optical inspection system 700 includes a first grating 114 and a second grating 714 disposed between the objective lens 112 and the linear polarizer 116. The two gratings 114 and 714 together provide the desired uniform linearization of the polarization of the scattered light 110 produced by surface scattering from the target 102. The optical inspection system 700 otherwise functions as described for the optical inspection system 100 (FIG. 1).

Figure 8:
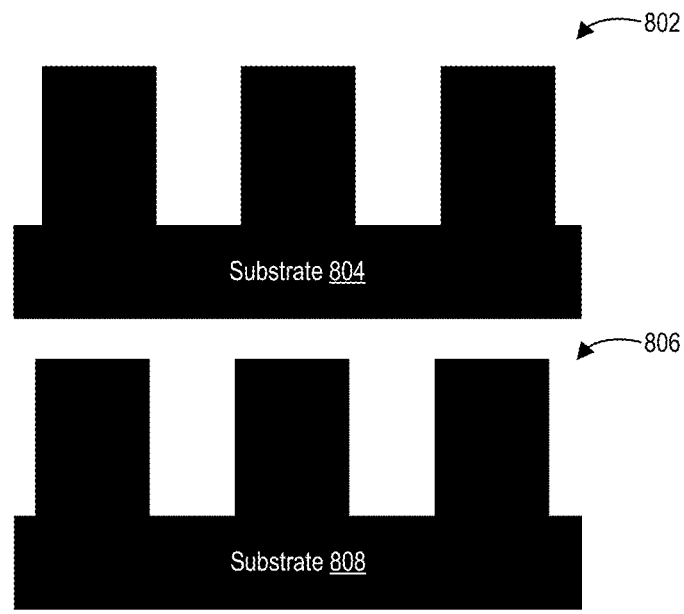
FIG. 8 is a cross-sectional view of two one-dimensional gratings on distinct respective substrates, in accordance with some embodiments.

FIG. 8 is a cross-sectional view of two one-dimensional gratings 802 and 806 in accordance with some embodiments. The first grating 802 is an example of the first grating 114 (FIG. 7) and the second grating 806 is an example of the second grating 714 (FIG. 7), or vice-versa. The first grating 802 is on a first substrate 804 and the second grating 806 is on a second substrate 808, which is distinct from the first substrate 804. The first grating 802 is composed of a single material, which may be the same material as the first substrate 804. The second grating 806 may also be composed of a single material, which may be the same as the second substrate 808. The first grating 802 and/or first substrate 804 may be composed of the same material as the second grating 806 and/or second substrate 808. Examples of the material for the first grating 802, first substrate 804, second grating 806, and/or second substrate 808 include, without limitation, fused silica, calcium fluoride, or sapphire.

Figure 9:
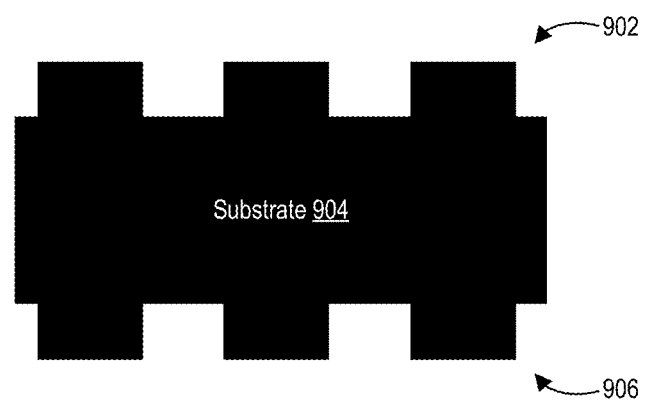
FIG. 9 is a cross-sectional view of two one-dimensional gratings on the same substrate, in accordance with some embodiments.

FIG. 9 is a cross-sectional view of two one-dimensional gratings 902 and 906 on the same substrate 904, in accordance with some embodiments. The first grating 902 is another example of the first grating 114 (FIG. 7) and the second grating 906 is another example of the second grating 714 (FIG. 7), or vice-versa. The gratings 902 and 906 are on opposite sides of the substrate 904: the first grating 902 is on a first side of the substrate 904 (e.g., the side facing the objective lens 112, FIG. 7) and the second grating 906 is on a second side of the substrate 904 (e.g., the side facing the linear polarizer 116, FIG. 7). The first grating 902 and/or the second grating 906 are composed of a single material, which may be the same material as the substrate 904. The first grating 902, substrate 904, and second grating 906 thus may all be composed of the same single material. Examples of the material for the first grating 902, substrate 904, and/or second grating 906 include, without limitation, silica or sapphire. The two gratings 902 and 906 effectively compose a double-sided grating. A double-sided grating has the advantage of low reflection without using anti-reflective coating.

In some embodiments, the multiple gratings have identical layouts. For example, the two gratings 802 and 806 (FIG. 8) or the two gratings 902 and 906 (FIG. 9) may have identical layouts, such that each grating 802 and 806, or 902 and 906, provides half the total phase retardation provided by the two gratings. The grating depth 212 of each of the two gratings 802 and 806 or each of the two gratings 902 and 906 may be half of the total depth for the desired phase retardation, thus relaxing the aspect ratio for each grating by a factor of two. The grating depth 212 may be uniform (i.e., constant) across each of the two gratings 802 and 806 or each of the two gratings 902 and 906.

Alternatively, the multiple gratings have different layouts (but may still have identical depths 212, which may be uniform across each grating). For example, the first grating 802 (FIG. 8) or 902 (FIG. 9) has a uniform duty cycle, such that its duty cycle is constant across the grating (and thus across the collection pupil), and has a varying orientation, such that its orientation (and thus its optical axis) varies spatially across the collection pupil. But the second grating 806 (FIG. 8) or 906 (FIG. 9) has a varying duty cycle, such that its duty cycle varies spatially across the grating (and thus across the collection pupil), and has a uniform grating orientation, such that its orientation (and thus its optical axis) is the same across the grating (and thus across the collection pupil). The uniform duty cycle of the first grating 802 or 902, combined with a uniform depth 212, results in a uniform phase retardation (e.g., half-wave or near half-wave). The varying orientation (and thus varying optical-axis angle) of the first grating 802 or 902 rotates the polarization so that long axes of the elliptical polarization are parallel. The varying duty cycle of the second grating 806 or 906 results in a varying phase retardation across the second grating 806 or 906 and thus across the collection pupil. The uniform orientation (i.e., optical-axis angle) but varying phase retardation of the second grating 806 or 906 linearizes the elliptical polarization. The light 110 produced by surface scattering may be nearly linearly polarized (i.e., only slightly elliptical) across a large portion of the collection pupil even before reaching the gratings, resulting in a nearly zero phase retardation and nearly zero grating linewidth 210 for much of the second grating 806 or 906.

In another example of multiple gratings with differing layouts, the first grating 802 (FIG. 8) or 902 (FIG. 9) has a duty cycle that varies spatially across the grating (and thus across the collection pupil) and an orientation (i.e., optical-axis angle) that varies spatially across the grating (and thus across the collection pupil). The second grating 806 (FIG. 8) or 906 (FIG. 9) also has a duty cycle that varies spatially across the grating (and thus across the collection pupil) and an orientation that varies spatially across the grating (and thus across the collection pupil). The first grating 802 or 902 has a depth that is uniform (i.e., constant) across the grating (and thus across the collection pupil) and the second grating 806 or 906 has a depth that is uniform across the grating (and thus across the collection pupil). These two depths may be equal.

In yet another example of multiple gratings with differing layouts, the first grating 802 (FIG. 8) or 902 (FIG. 9) and the second grating 806 (FIG. 8) or 906 (FIG. 9) have distinct orientations that vary spatially across the grating (and thus across the collection pupil), and thus have different optical-axis angle orientations, but also have substantially equal phase retardation (e.g., to within manufacturing tolerances). Such a layout may provide relaxed etch depth requirements and at the same time allow more flexibility for achieving the desired uniform linear polarization. The layout for two gratings with phase retardations of 90° may be determined based on the following mathematics.

The Jones matrix of two quarter-wave plate gratings having two different optical-axis angles $\theta_1$ and $\theta_2$ is:

$$J = \begin{bmatrix} 1 + j\cos 2\theta_1 & j\sin 2\theta_1 \\ j\sin 2\theta_1 & 1 - j\cos 2\theta_1 \end{bmatrix} \begin{bmatrix} 1 + j\cos 2\theta_2 & j\sin 2\theta_2 \\ j\sin 2\theta_2 & 1 - j\cos 2\theta_2 \end{bmatrix} = \quad (10)$$

$$\begin{bmatrix} (1 + j\cos 2\theta_1)(1 + j\cos 2\theta_2) - & (1 + j\cos 2\theta_1)j\sin 2\theta_2 + \\ \sin 2\theta_2 \sin 2\theta_1 & j\sin 2\theta_1(1 - j\cos 2\theta_2) \\ j\sin 2\theta_1(1 + j\cos 2\theta_2) + & -\sin 2\theta_1 \sin 2\theta_2 + \\ (1 - j\cos 2\theta_1)j\sin 2\theta_2 & (1 - j\cos 2\theta_1)(1 - j\cos 2\theta_2) \end{bmatrix}$$

The polarization transformation provided by these two gratings (i.e., by these two quarter-wave plates) is written as:

$$\begin{bmatrix} E'_x \\ E'_y \end{bmatrix} = \begin{bmatrix} 1 - \cos 2\alpha + 2j\cos\beta\cos\alpha & j2\sin\beta\cos\alpha - \sin 2\alpha \\ j2\sin\beta\cos\alpha - \sin 2\alpha & 1 - \cos 2\alpha + 2j\cos\beta\cos\alpha \end{bmatrix} \begin{bmatrix} 1 \\ re^{j\delta} \end{bmatrix} \quad (11)$$

where $\alpha = \theta_1 - \theta_2$ and $\beta = \theta_1 + \theta_2$.

To transform the scattering polarization into a uniform y-polarization (and thus into a uniform linear polarization), the x-component is set to zero:

$E'_x = [1 - \cos(2\alpha) + r \cos \delta \sin(2\alpha) + r \sin \delta(2 \sin \beta \cos \alpha)] + j[2 \cos \beta \cos \alpha + r \cos \delta(2 \sin \beta \cos \alpha) - r \sin \delta \sin(2\alpha)] = 0$ \quad (12)

Both the real part and the imaginary part of the x-component are set to zero:

$[\sin^2\alpha + r \cos \delta \sin \alpha \cos \alpha + r \sin \delta \sin \beta \cos \alpha] = 0$ \quad (13a)

$[\cos \alpha(\cos \beta + r \cos \delta \sin \beta - r \sin \delta \sin \alpha)] = 0$ \quad (13b)

Figure 10:
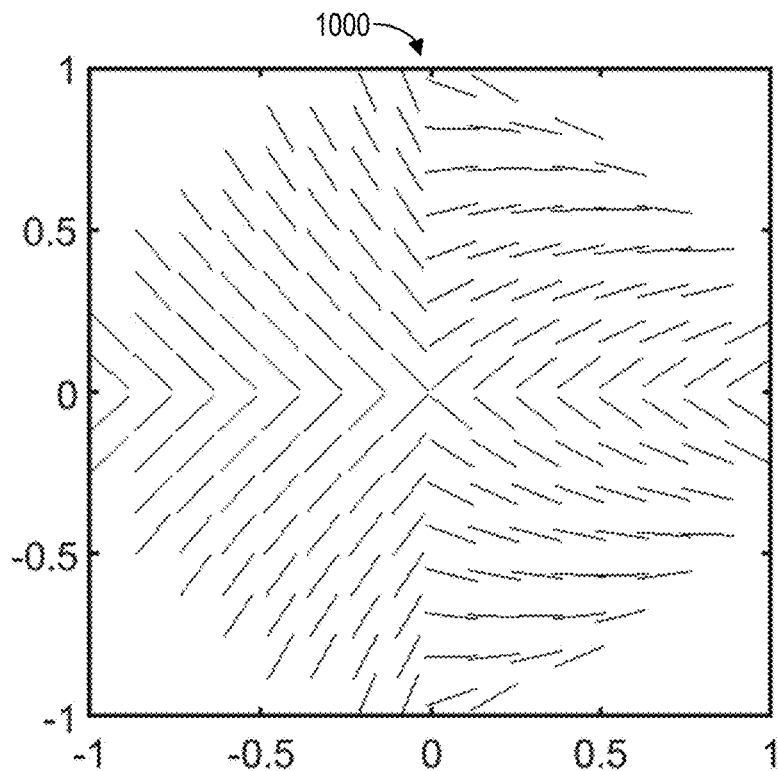
FIGS. 10 and 11 show spatially varying grating orientations across the collection pupil for a pair of gratings to be used as waveplates in an optical inspection system, in accordance with some embodiments.
Figure 11:
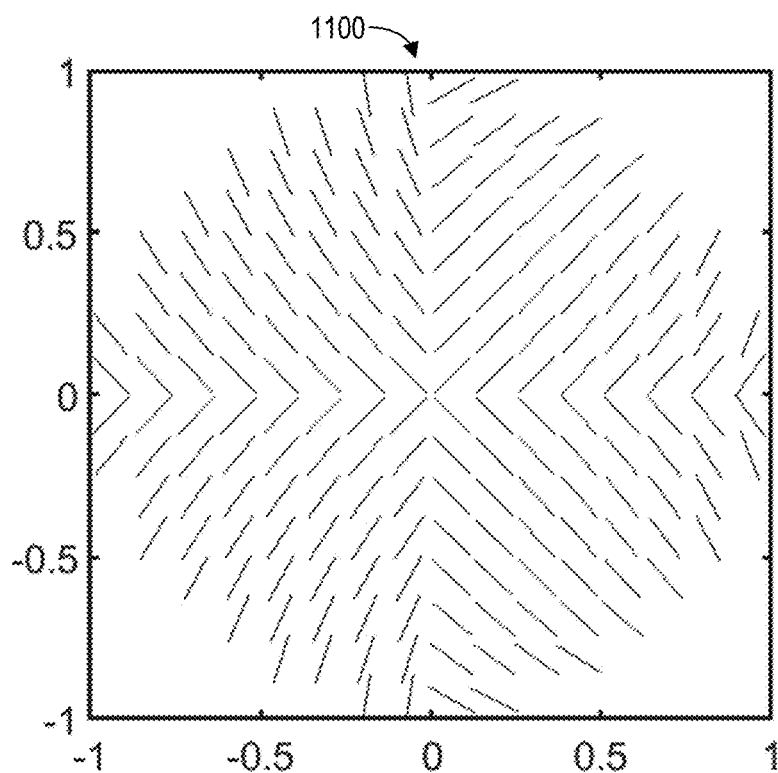

Equations 13a and 13b can be solved numerically to derive the layout of the optical-axis angles $\theta_1$ for the first grating 802 or 902 (i.e., for the first quarter-wave plate) and $\theta_2$ for the second grating 806 or 906 (i.e., for the second quarter-wave plate). FIGS. 10 and 11 are maps 1000 and 1100 showing the spatial variation of values of $\theta_1$ and $\theta_2$, respectively, across the collection pupil. The optical-axis angles of FIGS. 10 and 11 are calculated in accordance with equations 13a and 13b, assuming a depth 212 of 700 nm, a pitch 208 of 100 nm, and a 50% duty cycle for both gratings. The gratings of FIGS. 10 and 11 together transform elliptically polarized surface-scattering from oblique illumination into uniformly oriented linearly polarized light. The gratings of FIGS. 10 and 11 have quarterly continuous designs, such that the optical-axis angles (i.e., the grating orientations) are discontinuous across the horizontal and vertical axes through the centers of the gratings.

Figure 12:
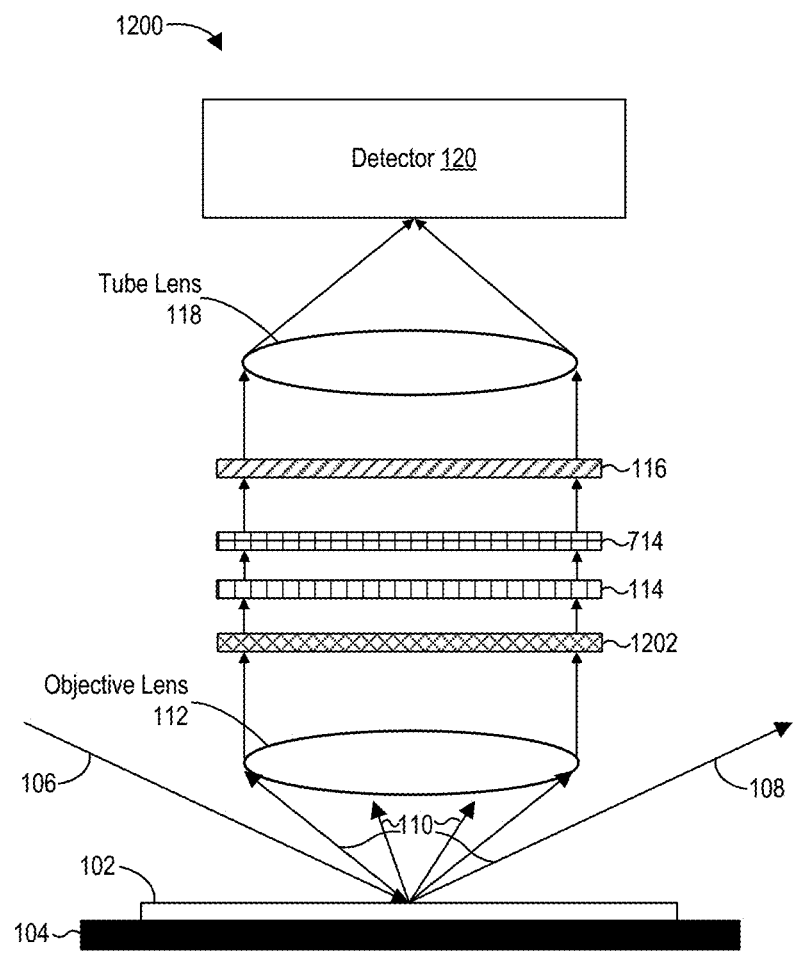
FIG. 12 is a cross-sectional view of a portion of an optical inspection system with a uniform grating in addition to two spatially varying gratings, in accordance with some embodiments.

FIG. 12 is a cross-sectional view of a portion of an optical inspection system 1200 in accordance with some embodiments. The optical inspection system 1200 includes the elements of the optical inspection system 700 arranged as in the optical inspection system 700 and further includes a uniform waveplate 1202. The uniform waveplate 1202 has uniform phase retardation and thus provides uniform phase retardation across the collection pupil for light 110 scattered from the target 102. In some embodiments, the first grating 114 and the second grating 714 are disposed between the uniform waveplate 1202 and the linear polarizer 116. The uniform waveplate 1202 may be disposed between the objective lens 112 and the first grating 114. The first grating 114 and second grating 714 may be the gratings 802 and 806 (FIGS. 8) or 902 and 906 (FIG. 9).

In some embodiments, the two gratings 114 and 714 (either on separate substrates 804 and 808, FIG. 8, or on a single substrate 904, FIG. 9) of the optical inspection system 1200 have different layouts and different optical-axis angle orientations but similar phase retardation. The layouts for the two gratings 114 and 714, to be used in conjunction with the uniform waveplate 1202, may be determined based on the following mathematics:

$$E'_x = [1-\cos(2\alpha) + r\cos(\delta+\delta')\sin(2\alpha) + r\sin(\delta+\delta')2\sin\beta\cos\alpha] + j[2\cos\beta\cos\alpha + r\cos(\delta+\delta')(2\sin\beta\cos\alpha) - r\sin(\delta+\delta')\sin(2\alpha)] \quad (14)$$

Both the real part and the imaginary part of the x-component are set to zero:

$$[\sin^2\alpha + r\cos(\delta+\delta')\sin\alpha\cos\alpha + r\sin(\delta+\delta')\sin\beta\cos\alpha] = 0 \quad (15a)$$

$$[\cos\alpha(\cos\beta + r\cos(\delta+\delta')\sin\beta - r\sin(\delta+\delta')\sin\alpha)] = 0 \quad (15b)$$

Figure 13:
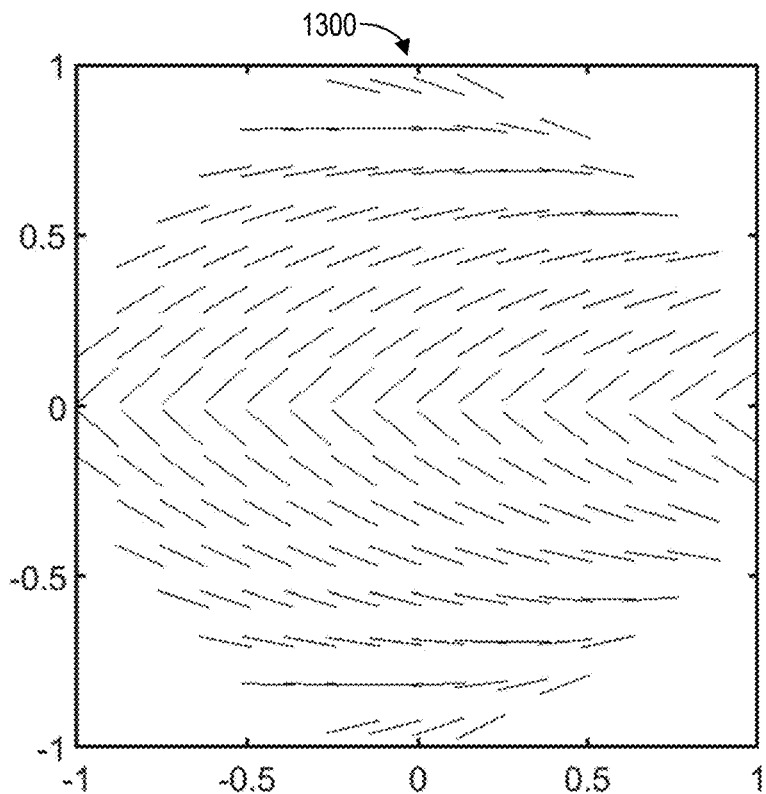
FIGS. 13 and 14 show spatially varying grating orientations across the collection pupil for a pair of gratings to be used as waveplates in conjunction with a uniform waveplate in an optical inspection system, in accordance with some embodiments.
Figure 14:
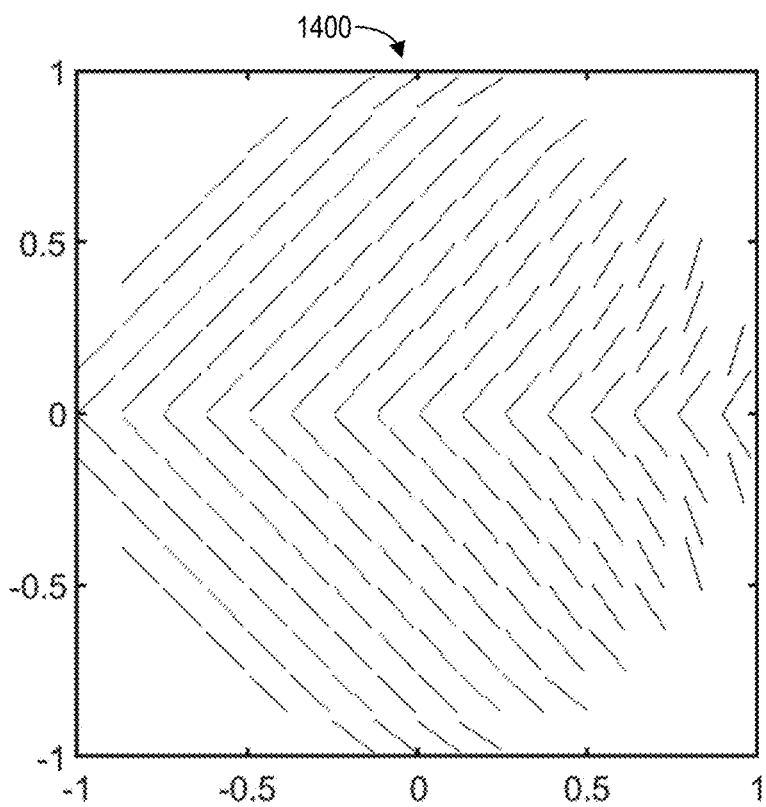

Equations 15a and 15b can be solved numerically to derive the layout of the respective optical-axis angles $\theta_1$ and $\theta_2$ for the two gratings 114 and 714. FIGS. 13 and 14 are maps 1300 and 1400 showing the spatial variation of values of $\theta_1$ and $\theta_2$, respectively. The optical-axis angles of FIGS. 13 and 14 are calculated in accordance with equations 15a and 15b, assuming the same depth 212, pitch 208, and duty cycle as for FIGS. 10 and 11, and assuming an extra phase retardation of pi/15 in the y-direction as provided by the uniform waveplate 1202 (FIG. 12). The gratings of FIGS. 13 and 14 together transform elliptically polarized surface-scattering from oblique illumination into uniformly oriented linearly polarized light. The gratings of FIGS. 13 and 14 have half-continuous designs, such that the optical-axis angles (i.e., the grating orientations) are discontinuous across the horizontal axes through the centers of the gratings but are continuous across the vertical axes through the centers of the gratings. The addition of the uniform waveplate 1202 thus allows a design in which the optical-axis angles of both gratings 114 and 714 are continuous over half of the pupil. Such a design has fewer interruptions of the wavefront over the collection pupil and therefore has less impact on the image quality for images of defects (e.g., particles) on the target 102.

In some embodiments, a two-dimensional (2D) grating with spatially varying phase retardation is used as one of the one or more gratings that convert the elliptically polarized light 110 produced by surface scattering from the target 102 to uniformly oriented linearly polarized light. Use of a 2D grating is another method of easing fabrication to achieve near-zero phase retardation. Near-zero phase retardation for a one-dimensional (1D) grating may involve a duty cycle of nearly 0% or 100%, resulting in a high aspect ratio. A 2D grating with equal duty cycles in the x- and y-directions can instead be used to achieve near-zero phase retardation. 2D gratings can also provide increased transmission without changing the phase retardation.

Figure 15A:
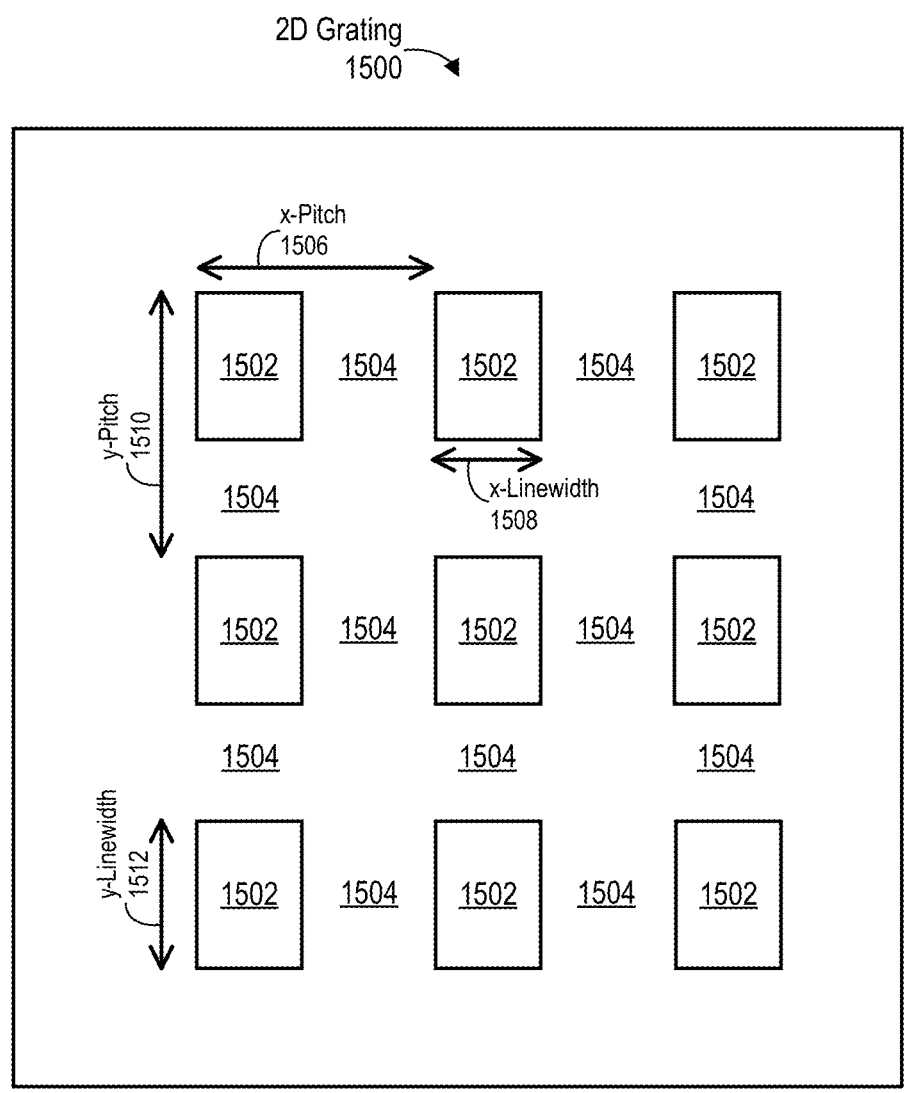
FIG. 15A is a plan view of a 2D grating in accordance with some embodiments.

FIG. 15A is a plan view of a 2D grating 1500 in accordance with some embodiments. The 2D grating 1500 may be an example of the grating 114 (FIG. 1). The 2D grating 1500 has posts (e.g., rectangles) 1502 separated by trenches 1504 in both the x- and y-directions: successive posts 1502 are separated from each other by respective trenches 1504 in both the x- and y-directions. The posts 1502 have an x-directional pitch 1506 (i.e., the spacing between successive posts 1502 in the x-direction), an x-directional linewidth 1508, a y-directional pitch 1510 (i.e., the spacing between successive posts 1502 in the y-direction), and a y-directional linewidth 1512. The 2D grating 1500 also has an x-directional duty cycle equal to the ratio of the x-directional linewidth 1508 to the x-directional pitch 1506, and a y-directional duty cycle equal to the ratio of the y-directional linewidth 1512 to the y-directional pitch 1510. The x-directional and/or y-directional duty cycles may vary spatially across the 2D grating 1500, and thus across the collection pupil. For example, the x-directional and/or y-directional duty cycles vary spatially across the 2D grating 1500 because the x-directional linewidth 1508 and/or the y-directional linewidth 1512 vary spatially while the x-directional pitch 1506 and the y-directional pitch 1510 are uniform across the 2D grating 1500 and thus across the collection pupil. In some embodiments, the depth of the trenches 1504 is uniform across the 2D grating 1500 and thus across the collection pupil.

The posts 1502 are composed of a single material (e.g., glass), which may be the same material as a substrate on which the posts 1502 are disposed. The 2D grating 1500 may be formed by etching the trenches 1504 into the substrate or by selective growth of the posts 1502 on the substrate. The posts 1502 and substrate may be any materials that are transparent to the wavelength of the scattered light 110 (e.g., may be insulators, and thus dielectric materials, that are transparent to the wavelength of the scattered light 110). In some embodiments, the single material for the posts 1502 is $SiO_2$ (e.g., fused silica) and the substrate may also be $SiO_2$ (e.g., fused silica). In some other embodiments, the single material for the posts 1502 is sapphire and the substrate may also be sapphire. Sapphire has a higher index of refraction than $SiO_2$ and therefore provides stronger phase retardation with a smaller depth 212 than $SiO_2$. In yet some other embodiments, the single material for posts 1502 is calcium fluoride ($CaF_2$) and the substrate may also be $CaF_2$.

Figure 15B:
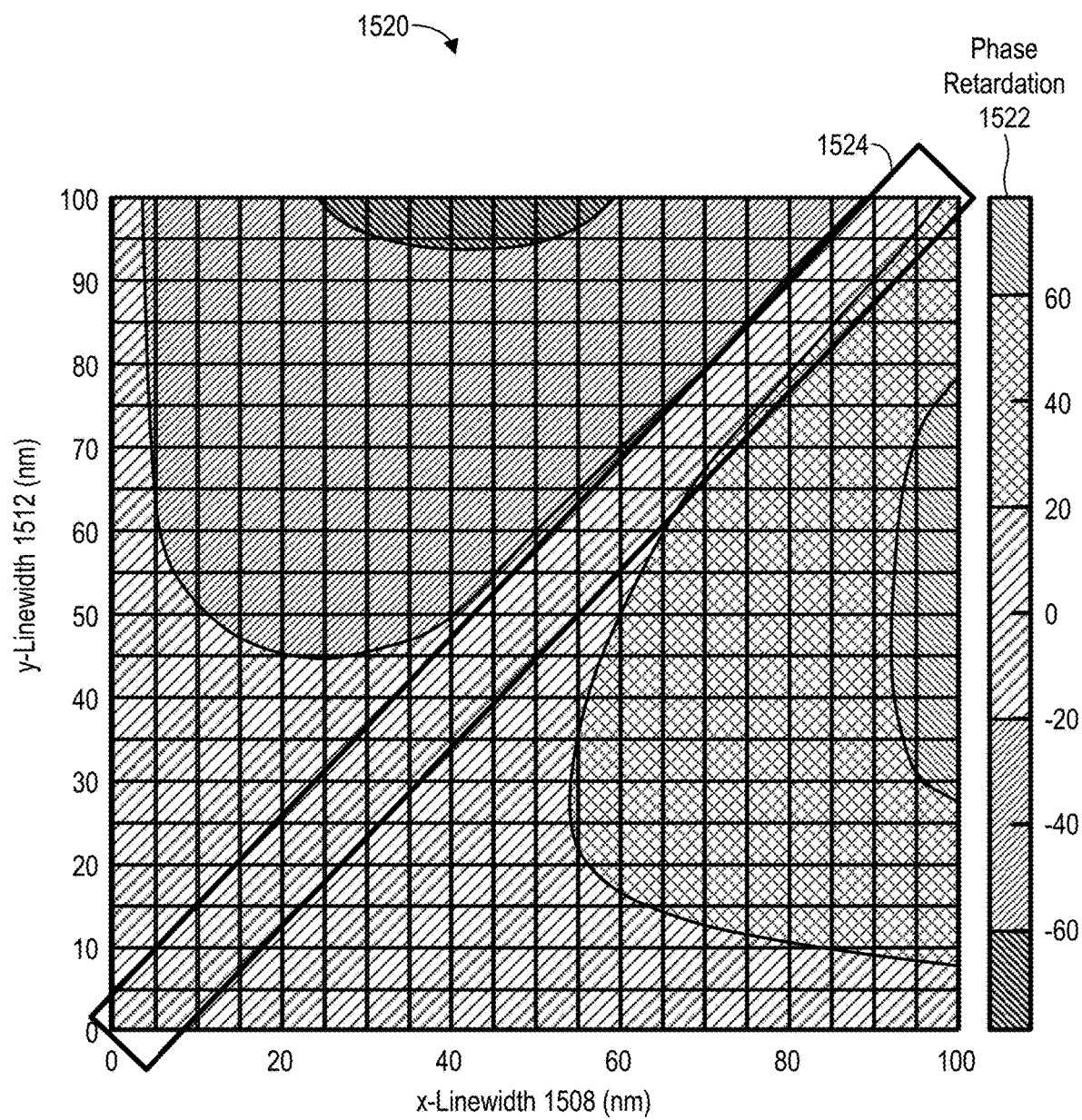
FIG. 15B is a graph showing simulated phase-retardation values for combinations of x-directional linewidths and y-directional linewidths for the 2D grating of FIG. 15A.
Figure 15C:
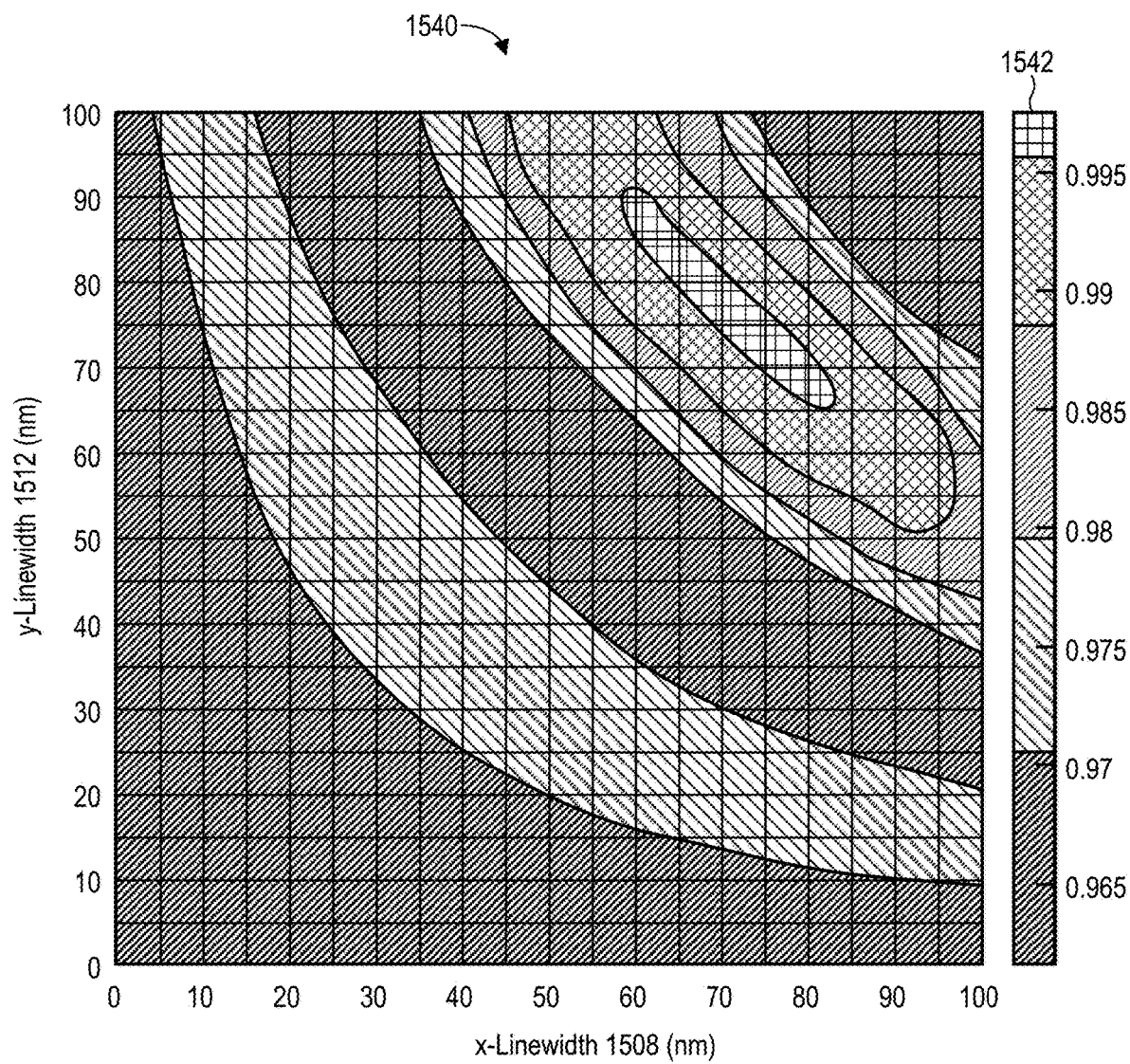
FIG. 15C is a graph showing simulated transmission through the 2D grating of FIG. 15A for combinations of x-directional linewidths and y-directional linewidths.

FIG. 15B is a graph 1520 showing simulated phase-retardation values for combinations of x-directional linewidths 1508 and y-directional linewidths 1512. The simulations used to generate the graph 1520 assume that the x-directional pitch 1506 and the y-directional pitch 1510 both equal 100 nm. A region 1524 in the graph 1520 has a nearly zero phase retardation 1522. FIG. 15C is a graph 1540 showing simulated transmission 1542 through a 2D grating 1500 for combinations of x-directional linewidths 1508 and y-directional linewidths 1512. A maximum transmission 1542 of approximately 99.6% is achieved.

Figure 16:
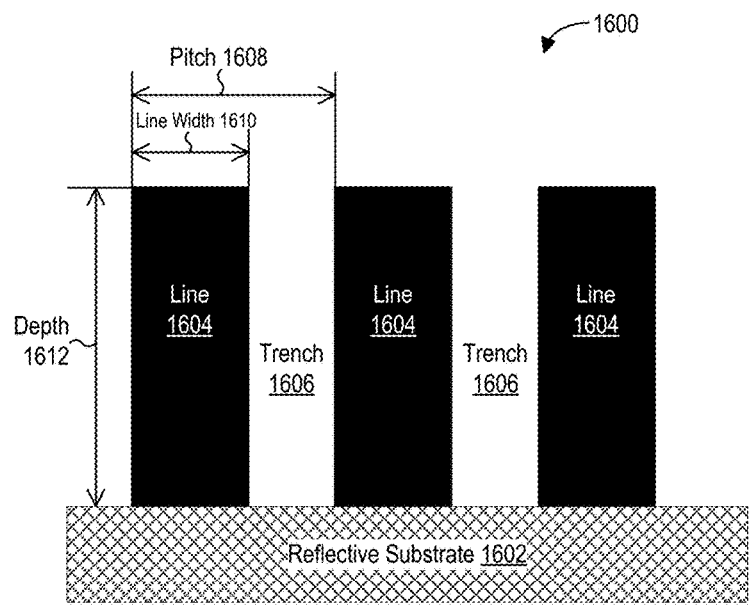
FIG. 16 is a cross-sectional view of a grating on a reflective substrate in accordance with some embodiments.

In the embodiments described above, the grating(s) and corresponding substrate(s) are transmissive. Alternatively, the substrate(s) for the grating(s) may be reflective. FIG. 16 is a cross-sectional view of a grating 1600 on a reflective substrate 1602 in accordance with some embodiments. The grating 1600, like the grating 200 (FIG. 2), is a waveplate with phase retardation based on form birefringence. The grating 1600 includes a series of lines 1604 on the substrate 1602. Successive lines 1604 in the series are separated by respective trenches 1606. The lines 1604 and trenches 1606 extend in a direction out of (or equivalently, into) the page for FIG. 16. The lines 1604 and trenches 1606 thus are parallel to an axis perpendicular to the page of FIG. 16 and perpendicular to the horizontal axis of FIG. 16. The grating 1600 is a one-dimensional grating.

The distance between (i.e., spacing of) successive lines 1604 is the pitch 1608. The lines 1604 have a line width 1610. The trenches 1606 have a depth 1612. In some embodiments, the grating depth 1612 may be set to a fixed value (i.e., to a constant depth for the entire grating 1600) (e.g., corresponding to the middle of the range of phase retardation within the collection pupil).

The reflective substrate 1602 is composed of metal or another reflective material. The lines 1604 may be composed of a single material (e.g., glass). Examples of the single material include, without limitation, $SiO_2$ (e.g., fused silica), sapphire, or $CaF_2$. Alternatively, the lines 1604 may have multiple layers, with different layers being composed of different respective materials. In general, while the substrate 1602 is reflective, the lines 1604 may be made of one or more materials that are transparent to the wavelength of the scattered light 110 (e.g., may be insulators, and thus dielectric materials, that are transparent to the wavelength of the scattered light 110). Other than the reflective substrate 1602, the grating 1600 may be designed as described for the grating 200 (FIG. 2).

Figure 17:
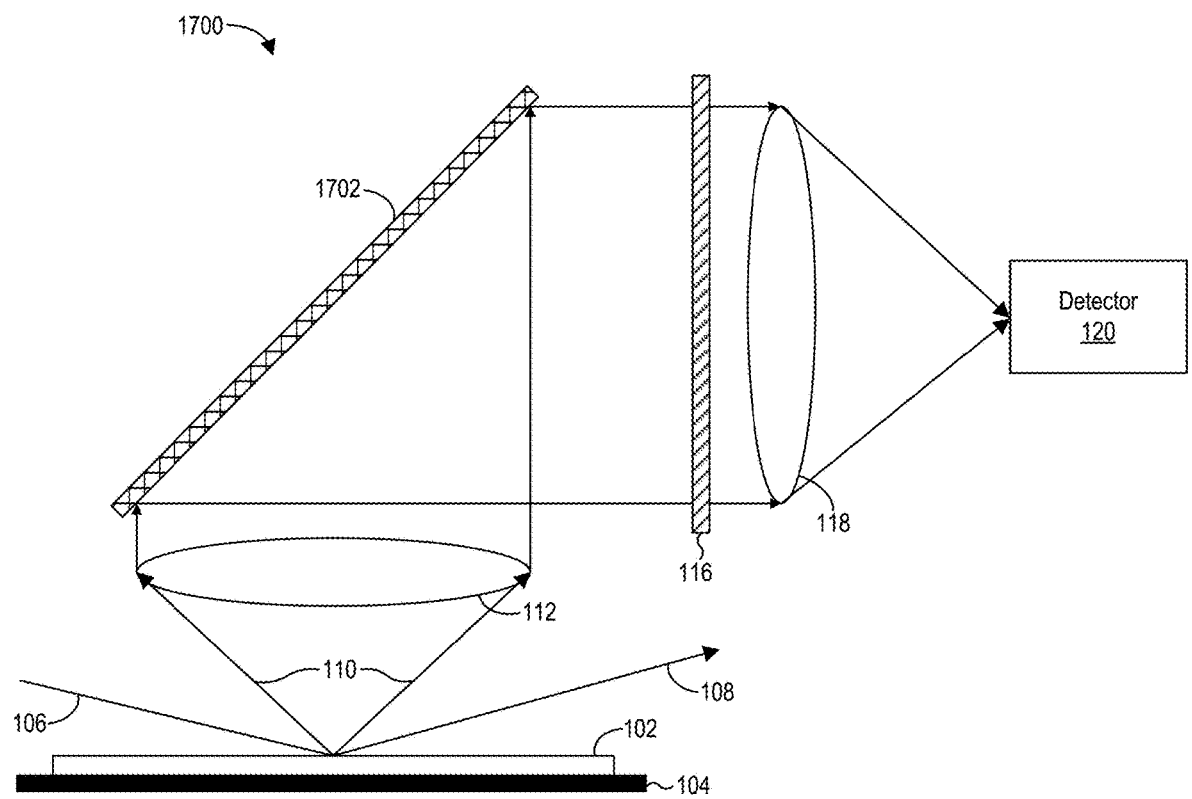
FIG. 17 is a cross-sectional view of a portion of an optical inspection system in accordance with some embodiments.

FIG. 17 is a cross-sectional view of a portion of an optical inspection system 1700 in accordance with some embodiments. The optical inspection system 1700 corresponds to the optical inspection system 100 (FIG. 1), with the grating 114 being replaced with a grating 1702 on a reflective substrate. The grating 1702 and its reflective substrate are examples of the grating 1600 and reflective substrate 1602 (FIG. 16). The grating 1702 is disposed between the objective lens 112 and the linear polarizer 116 along the path of the scattered light 110. The reflective substrate of the grating 1702 directs the scattered light 110 from the objective lens 112 toward the linear polarizer 116. The grating 1702 may have a layout as described for the grating 114 (e.g., for the grating 200), in accordance with some embodiments.

Instead of a single grating 1702 on a reflective substrate, an optical inspection system may have multiple gratings on respective reflective substrates (e.g., multiple gratings 1600 on respective reflective substrates 1602, FIG. 16). For example, an optical inspection system may have two such gratings.

Figure 18:
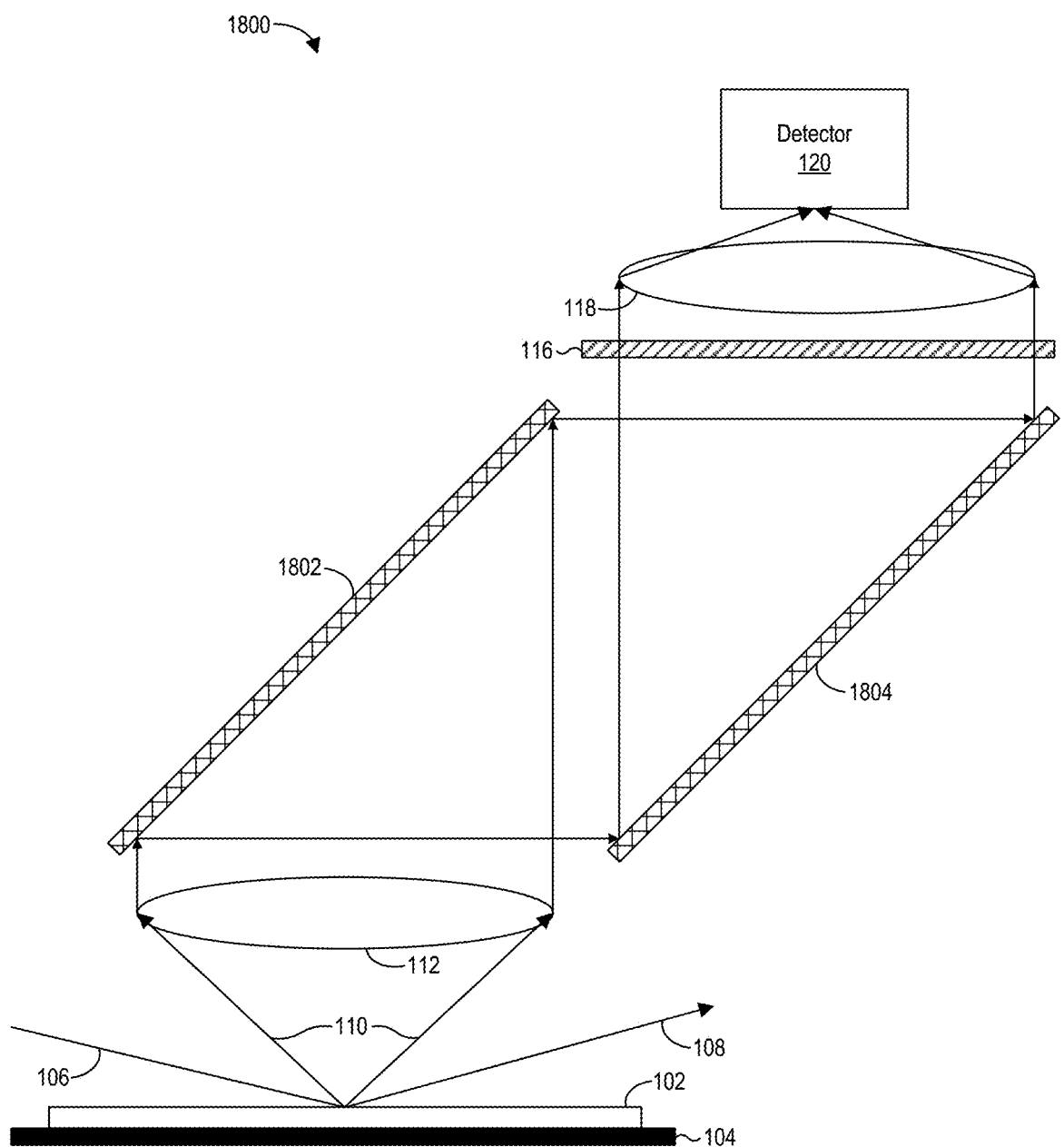
FIGS. 18 and 19 are cross-sectional views of respective portions of optical inspection systems, in accordance with some embodiments.
Figure 19:
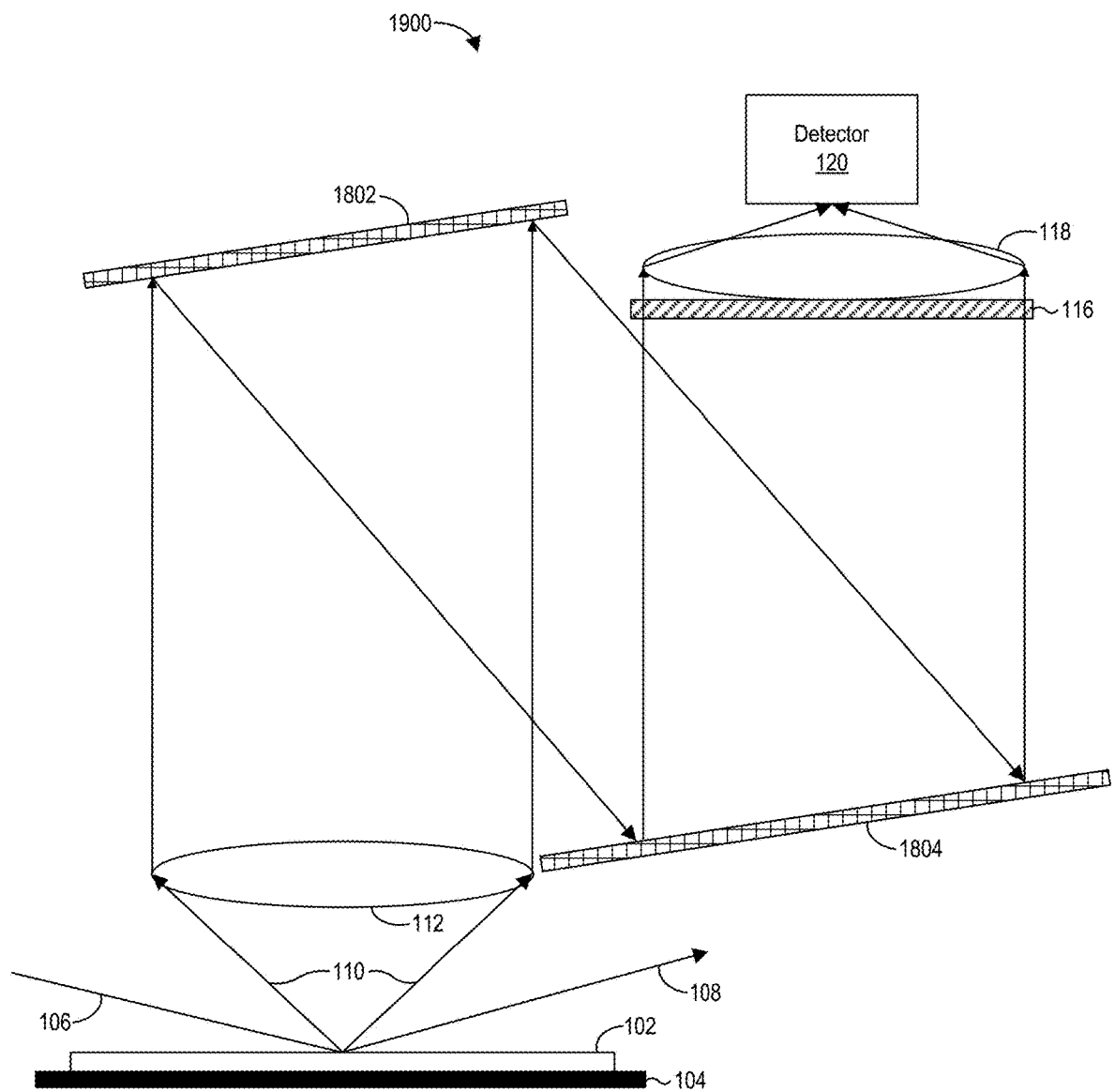

FIGS. 18 and 19 are cross-sectional views of respective portions of optical inspection systems 1800/1900, in accordance with some embodiments. The optical inspection systems 1800/1900 correspond to the optical inspection system 700, with the first grating 114 and the second grating 714 being replaced with a first grating 1802 on a reflective substrate and a second grating 1804 on a reflective substrate. The first grating 1802 and its reflective substrate are examples of the grating 1600 and reflective substrate 1602 (FIG. 16), as are the second grating 1804 and its reflective substrate. The first grating 1802 with its reflective substrate and the second grating 1804 with its reflective substrate are disposed between the objective lens 112 and the linear polarizer 116 along the path of the scattered light 110. The reflective substrate of the first grating 1802 directs the scattered light 110 from the objective lens 112 toward the second grating 1804. The reflective substrate of the second grating 1804 directs the scattered light 110 from the first grating 1802 toward the linear polarizer 116. The optical inspection systems 1800 and 1900 differ in the angles at which the first grating 1802 and the second grating 1804, as disposed on their respective substrates, are situated in the system. The first grating 1802 and the second grating 1804 may have respective layouts as described for the first grating 802 and the second grating 804 (e.g., may have any of the identical layouts or different layouts described for the first grating 802 and the second grating 804).

In some embodiments, a 2D grating that has spatially varying phase retardation and is disposed on a reflective substrate is used as one of the one or more gratings that convert the elliptically polarized light 110 produced by surface scattering from the target 102 to uniformly oriented linearly polarized light. For example, the 2D grating 1500 (FIG. 15A) may be disposed on a reflective substrate instead of a transmissive substrate.

An optical inspection system with multiple gratings may include a mix of one or more gratings with transmissive substrates and one or more gratings with reflective substrates. An optical inspection system with at least one grating on a reflective substrate may also have a uniform waveplate (e.g., uniform waveplate 1202, FIG. 12) that provides uniform phase retardation for the scattered light 110.

Figure 20:
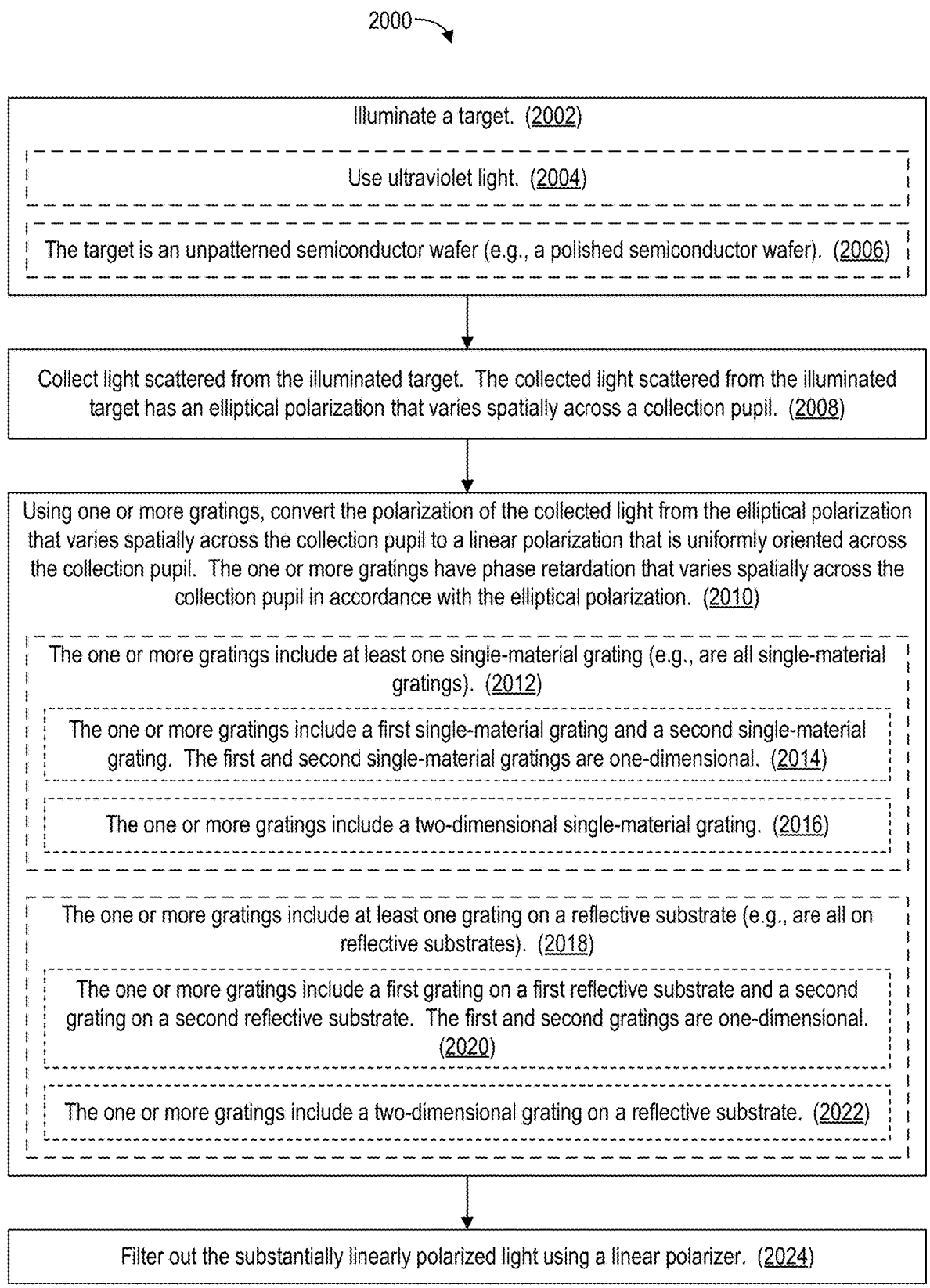
FIG. 20 is a flowchart illustrating a method of filtering out light from surface scattering while inspecting a target, in accordance with some embodiments.

FIG. 20 is a flowchart illustrating a method 2000 of filtering out light from surface scattering while inspecting a target, in accordance with some embodiments. The method 2000 may be performed using an optical inspection system 100 (FIG. 1), 700 (FIG. 7), 1200 (FIG. 12), 1700 (FIG. 17), 1800 (FIG. 18), or 1900 (FIG. 19). While the steps in the method 2000 are described in a particular order, they may be performed simultaneously in an ongoing manner.

In the method 2000, a target (e.g., target 102, FIG. 1, 7, 12, or 17-19) is illuminated (2002) (e.g., with light 106 at an oblique angle, FIG. 1, 7, 12, or 17-19). In some embodiments, the target is illuminated using (2004) ultraviolet light. For example, the target is illuminated with ultraviolet light with a wavelength of 130 nm or greater (e.g., DUV or VUV light). In some embodiments, the target is (2006) a semiconductor wafer (e.g., an unpatterned semiconductor wafer). For example, the target may be a polished semiconductor wafer.

Light that is scattered from the illuminated target (e.g., scattered light 110, FIG. 1, 7, 12, or 17-19) is collected (2008). For example, scattered light 110 is collected using the objective lens 112 (FIG. 1, 7, 12, or 17-19). The collected light scattered from the illuminated target has an elliptical polarization that varies spatially across a collection pupil. The spatial variation of the elliptical polarization may include spatial variation of its orientation.

Using one or more gratings, the polarization of the collected light is converted (2010) from the elliptical polarization that varies spatially across the collection pupil to a linear polarization that is uniformly oriented across the collection pupil. The one or more gratings have phase retardation that varies spatially across the collection pupil in accordance with the elliptical polarization. In addition to the one or more gratings with spatially varying phase retardation, a uniform waveplate (e.g., uniform waveplate 1202, FIG. 12) may be used.

In some embodiments, the one or more gratings include (2012) at least one single-material grating (e.g., the grating 114, FIG. 1; one or more gratings 200, FIG. 2). For example, all of the gratings may be single-material gratings. The one or more gratings may include (2014) a first single-material grating and a second single-material grating (e.g., gratings 114 and 714, FIG. 7 or 12). The first and second gratings may be one-dimensional (e.g., gratings 802 and 806, FIG. 8; gratings 902 and 906, FIG. 9). The one or more gratings may include (2016) a two-dimensional single-material grating (e.g., 2D grating 1500, FIG. 15A).

In some embodiments, the one or more gratings include (2018) at least one grating on a reflective substrate (e.g., one or more gratings 1600, FIG. 16; the grating 1702, FIG. 17; gratings 1802 and 1804, FIGS. 18-19). For example, all of the gratings may be on reflective substrates. The one or more gratings may include (2020) a first grating on a first reflective substrate and a second grating on a second reflective substrate. The first and second gratings may be one-dimensional. The one or more gratings may include (2022) a two-dimensional grating on a reflective substrate.

The substantially linearly polarized light is filtered out (2024) using a linear polarizer (e.g., linear polarizer 116, FIG. 1, 7, or 12). The method 2000 thus improves the signal-to-noise ratio for defect detection (e.g., particle detection) on the target by filtering out scattered light produced by surface scattering on the target. The scattered light is a sort of haze that, if left unfiltered, would degrade the image quality for the optical inspection system.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An optical inspection system, comprising:
   one or more gratings to convert a polarization of light scattered from a target from an elliptical polarization that varies spatially across a collection pupil to a linear polarization that is uniformly oriented across the collection pupil, wherein:
     the one or more gratings have phase retardation that varies spatially across the collection pupil in accordance with the elliptical polarization, and
     the one or more gratings comprise at least one grating on a reflective substrate; and
   a linear polarizer to filter out the light having the linear polarization.

2. The system of claim 1, wherein the target is a semiconductor wafer.

3. The system of claim 2, wherein the semiconductor wafer is unpatterned.

4. The system of claim 3, wherein the unpatterned semiconductor wafer is polished.

5. The system of claim 1, wherein the light is ultraviolet.

6. The system of claim 1, wherein:
   the one or more gratings comprise a first grating and a second grating;
   the first and second gratings are one-dimensional;
   the first grating is on a first reflective substrate; and
   the second grating is on a second reflective substrate.

7. The system of claim 6, wherein:
   the first grating has a duty cycle that varies spatially across the collection pupil and an orientation that varies spatially across the collection pupil; and
   the second grating has a duty cycle that varies spatially across the collection pupil and an orientation that varies spatially across the collection pupil.

8. The system of claim 7, wherein:
   the first grating has a depth that is constant across the collection pupil; and
   the second grating has a depth that is constant across the collection pupil.

9. The system of claim 6, wherein:
   the first grating has a uniform duty cycle and an orientation that varies spatially across the collection pupil; and
   the second grating has a duty cycle that varies spatially across the collection pupil and a uniform orientation.

10. The system of claim 6, wherein the first grating and the second grating have identical layouts.

11. The system of claim 6, wherein:
    the first grating and the second grating have distinct orientations that vary spatially across the collection pupil; and
    the first grating and the second grating have substantially equal phase retardation.

12. The system of claim 6, further comprising a uniform waveplate to provide uniform phase retardation for the light scattered from the target.

13. The system of claim 12, wherein the first grating and the second grating are disposed between the uniform waveplate and the linear polarizer.

14. The system of claim 1, wherein the one or more gratings comprise a two-dimensional grating on a reflective substrate.

15. A method, comprising:
    illuminating a target;
    collecting light scattered from the illuminated target, wherein the collected light scattered from the illuminated target has an elliptical polarization that varies spatially across a collection pupil;
    using one or more gratings, converting the polarization of the collected light from the elliptical polarization that varies spatially across the collection pupil to a linear polarization that is uniformly oriented across the collection pupil, wherein:
      the one or more gratings have phase retardation that varies spatially across the collection pupil in accordance with the elliptical polarization, and
      the one or more gratings comprise at least one grating on a reflective substrate; and
    using a linear polarizer, filtering out the light having the linear polarization that is uniformly oriented across the collection pupil.

16. The method of claim 15, wherein the target is a semiconductor wafer.

17. The method of claim 16, wherein the semiconductor wafer is unpatterned.

18. The method of claim 17, wherein the unpatterned semiconductor wafer is polished.

19. The method of claim 15, wherein the light is ultraviolet.

20. The method of claim 15, wherein:
   the one or more gratings comprise a first grating and a second grating;
   the first and second gratings are one-dimensional;
   the first grating is on a first reflective substrate; and
   the second grating is on a second reflective substrate.

21. The method of claim 15, wherein the one or more gratings comprise a two-dimensional grating on a reflective substrate.

* * * * *